(12) United States Patent
Mateu Sáez et al.

(10) Patent No.: US 9,450,504 B2
(45) Date of Patent: Sep. 20, 2016

(54) RECTIFIER CIRCUIT WITH AC SIDE SHORT-CIRCUITING FUNCTION AND SYNCHRONIZED SWITCH HARVESTING ON INDUCTOR CONVERTER

(71) Applicant: Fraunhofer-Gesellschaft zur Foerderung der angewandten Forschung e.V., Munich (DE)

(72) Inventors: Maria Loreto Mateu Sáez, Nuremberg (DE); Henrik Zessin, Erlangen (DE); Lars Luehmann, Nuremberg (DE); Peter Spies, Herzogenaurach (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 233 days.

(21) Appl. No.: 14/246,303

(22) Filed: Apr. 7, 2014

(65) Prior Publication Data
US 2014/0218989 A1    Aug. 7, 2014

Related U.S. Application Data

(63) Continuation of application No. PCT/EP2012/069902, filed on Oct. 8, 2012.

(30) Foreign Application Priority Data

Oct. 7, 2011 (EP) .................... 11184378
Oct. 7, 2011 (EP) .................... 11184380

(51) Int. Cl.
*H02M 7/06* (2006.01)
*G01R 19/04* (2006.01)
(Continued)

(52) U.S. Cl.
CPC ............ *H02M 7/06* (2013.01); *G01R 19/04* (2013.01); *H02H 7/125* (2013.01); *H02N 2/181* (2013.01)

(58) Field of Classification Search
CPC .. H02M 7/06; H02M 1/4208; H02M 1/4225; Y02B 70/126; G01R 19/04; H02H 7/125
USPC ......... 363/21.1, 89, 126; 323/224, 266, 271, 323/282, 283; 327/58–62
See application file for complete search history.

(56) References Cited

U.S. PATENT DOCUMENTS 6,275,016 B1 * 8/2001 Ivanov ................. H02M 3/158
                                                    323/224
2004/0239373 A1   12/2004 Seshita
(Continued)

FOREIGN PATENT DOCUMENTS

CN    1574523 A    2/2005
CN    1954226 A    4/2007
(Continued)

OTHER PUBLICATIONS

Resonant Rectifier for Piezoelectric Sources Sam Ben-Yaakov and Natan Krihely Power Electronics Laboratory, Department of Electrical and Computer Engineering Ben-Gurion University of the Negev, P.O.Box 653, Beer-Sheva E4 105, Israel. 2005, IEEE.*
(Continued)

*Primary Examiner* — Yemane Mehari
(74) *Attorney, Agent, or Firm* — Keating & Bennett, LLP

(57) ABSTRACT

Rectifier circuit including a pair of input terminals, a pair of output terminals, and a first circuit interconnecting the pair of input terminals. The first circuit includes an energy storing element and a rectifier bridge, wherein the rectifier bridge includes at least one controllable switching element per bridge branch. An output of the rectifier bridge supplies the pair of output terminals and wherein the at least one controllable switching element per bridge branch is configured to provide a temporary conducting path via the rectifier bridge which bypasses the pair of output terminals and which short-circuits a series connection of the energy storing element and an energy source connectable to the pair of input terminals. A converter for synchronized switch harvesting on inductor including such a rectifier circuit and a method for rectifying an electrical current generated by an energy source are also described.

34 Claims, 12 Drawing Sheets

(51) Int. Cl.
 H02N 2/18 (2006.01)
 H02H 7/125 (2006.01)

(56) References Cited

U.S. PATENT DOCUMENTS

2005/0258855 A1 11/2005 Kimura
2011/0227543 A1 9/2011 Ivanov

FOREIGN PATENT DOCUMENTS

| DE | 195 34 464 C1 | 12/1996 |
| EP | 0 514 755 A1 | 11/1992 |
| EP | 2 458 737 A1 | 5/2012 |
| GB | 888692 A | 12/1957 |
| JP | 59-221814 A | 12/1984 |
| WO | 2007/063194 A1 | 6/2007 |
| WO | 2011/093966 A1 | 8/2011 |

OTHER PUBLICATIONS

English Translation of Official Communication issued in corresponding Chinese Patent Application No. 201280059568X, mailed on Aug. 21, 2015.

Official Communication issued in International Patent Application No. PCT/EP2012/069902, mailed on Jun. 8, 2013.

Mickaël Lallart et al.: "An optimized self-powered switching circuit for non-linear energy harvesting with low voltage output"; Smart Materials and Structures; IOP Publishing Ltd.; vol. 17; No. 3; Jun. 1, 2008; pp. 1-8.

Elie Lefeuvre et al.: "A comparison between several vibration-powered piezoelectric generators for standalone systems"; Sensors and Actuators A; Elsevier Sequoia S.A.; vol. 126; No. 2; Feb. 14, 2006; pp. 405-416.

Loreto Mateu et al.: "Modified Parallel SSHI AC-DC Converter for Piezoelectric Energy Harvesting Power Supplies"; Telecommunications Energy Conference; IEEE; Oct. 9, 2011; pp. 1-7.

Sam Ben-Yaakov et al.: "Resonant Rectifier for Piezoelectric Sources"; Applied Power Electronics Conference and Exposition; vol. 1; Mar. 6, 2005; pp. 249-253.

S. Priya et al.: "Energy Harvesting Technologies"; Springer; 2009; pp. 209-259.

D. Guyomar et al.: "Energy Harvesting from Ambient Vibrations and Heat"; Journal of Intelligent Material Systems and Structures; vol. 20; No. 5; Mar. 2005; pp. 609-624.

Official Communication issued in corresponding Japanese Patent Application No. 2014-533947 mailed on Apr. 7, 2015.

Mateu Sáez et al.; "Peak Dectector With Improved False Peak Rejection"; U.S. Appl. No. 14/230,333, filed Mar. 31, 2014.

* cited by examiner

_US 9,450,504 B2_

RECTIFIER CIRCUIT WITH AC SIDE SHORT-CIRCUITING FUNCTION AND SYNCHRONIZED SWITCH HARVESTING ON INDUCTOR CONVERTER

CROSS-REFERENCE TO RELATED APPLICATIONS

This application is a continuation of copending International Application No. PCT/EP2012/069902, filed Oct. 8, 2012, which is incorporated herein by reference in its entirety, and additionally claims priority from European Applications Nos. EP 11 184 378.5, filed Oct. 7, 2011, and EP 11 184 380.1, filed Oct. 7, 2011, both of which are incorporated herein by reference in their entirety.

Embodiments of the present invention relate to a rectifier circuit. Some embodiments relate to a converter for synchronized switch harvesting on inductor (SSHI). Some embodiment relate to a method for rectifying an electrical current. Some embodiments relate to a modified parallel SSHI converter.

BACKGROUND OF THE INVENTION

Energy harvesting (also known as power harvesting or energy scavenging) is a process by which energy is derived from external sources (e.g., solar power, thermal energy, wind energy, salinity gradients, and kinetic energy), captured, converted into electrical energy and stored for low-power wireless autonomous devices, like those used in wearable electronics and wireless sensor networks. For example, piezoelectric transducers are employed for harvesting electrical power from vibrations. Different AC-DC converters are described in the literature in order to rectify the AC power and extract the maximum amount of power.

Possible applications of energy harvesters comprising such AC-DC converters for piezoelectric generators are, e.g., in applications like highway bridges (structural health monitoring) or railway trains (tracking and tracing). The frequency range of the vibrations associated to these applications is between 2 and 50 Hz, whereas mean accelerations are around 0.1 g.

The admittance locus of a piezoelectric transducer has intrinsic information about for which piezoelectric transducers the employment of a SSHI converter instead of a diode bridge will provide a significant increase in the harvested power. The internal impedance of a piezoelectric element is complex, as described by J. Brufau-Penella and M. Puig-Vidal in "Piezoelectric energy harvesting improvement with complex conjugate impedance matching," Journal of Intelligent Material Systems and Structures, vol. 00-2008, 2008. Therefore, the maximum output power of the piezoelectric. transducer is obtained when the complex conjugate of the internal impedance is connected as output load. However, this solution is unrealistic since the inductance needed as complex conjugate load would be too large due to the dominant capacitive characteristic of piezoelectric elements. If a resistor is connected as a load to the piezoelectric element, the output power obtained depends on the mechanical frequency that excites the piezoelectric element and the resistance. The maximum output power in this case is typically obtained with a resistance that is equal to the modulus of the equivalent Thevenin impedance of the piezoelectric element at the frequency where the ratio of the real and imaginary parts of the admittance of the piezoelectric element is maximized. Thus, the maximum output power is obtained at the frequency where the admittance of the piezoelectric element has its most resistive behavior.

The peak value of the ratio between the output power when a resistor is the load and the maximum power, depends on the impedance circle of the piezoelectric element. There are piezoelectric elements were the maximum of this ratio is close to one and others were this ratio is much lower. For the piezoelectric elements with a ratio close to 1, the employment of non-linear techniques is not going to provide an improvement over the rectifier bridge. However, for piezoelectric elements where this ratio is far away from 1, the non-linear converters are a better solution than the rectifier bridge.

The Synchronized Switch Harvesting on Inductor (SSHI) is a non-linear switching technique that provides DC (direct current) power from an energy source, such as a mechanically excited piezoelectric element. A SSHI converter typically consists of a switch and an inductor plus a diode bridge. The mechanically excited piezoelectric element typically produces an alternating electric voltage and an alternating current (AC).

An efficient AC-DC converter for piezoelectric elements during vibration is of special importance for maximizing the harvested power.

The AC power delivered by, for example, piezoelectric transducers can be rectified with a diode bridge and a filtering capacitor (linear technique).

A more recent AC-DC converter which employs an inductor connected through a switch to the piezoelectric element (called SSHI) is also available. The switch is closed when the piezoelectric peak displacement is reached. The connection of the piezoelectric element with the inductor causes a resonant effect and a fast inversion of the piezoelectric voltage. After the piezoelectric voltage inversion, the switch is opened until a new peak is detected. However, the diodes of the diode bridge still induce voltage gaps which causes losses in the harvesting circuit and limits the harvested power.

In a further development of AC-DC converters for SSHI converters, the switch or switches for the inversion of the piezoelectric voltage are separated and two diodes of the diode bridge are replaced by these switches. Hence, the circuit includes less components, thus reducing the cost and the dimensions of the circuit. Another benefit is the removal of the diodes that induce voltage gaps. Therefore, losses introduced by such voltage gaps in the harvesting circuit are limited and the harvested power is thus greater. However, the amount of energy extracted from the piezoelectric element per cycle may still be comparatively low and only a fraction of theoretically extractable energy amount.

SUMMARY

According to an embodiment, a rectifier circuit may have: a pair of input terminals; a pair of output terminals; a first circuit interconnecting the pair of input terminals, the first circuit including an energy storing element and a rectifier bridge, wherein the rectifier bridge includes at least one controllable switching element per bridge branch, wherein an output of the rectifier bridge supplies the pair of output terminals and wherein the at least one controllable switching element per bridge branch is configured to provide a temporary conducting path via the rectifier bridge which bypasses the pair of output terminals and which short-circuits a second circuit including the energy storing element, the pair of input terminals, and an energy source connectable to the pair of input terminals.

According to another embodiment, a converter for synchronized switch harvesting on inductor may have a rectifier circuit according to claim 1.

According to another embodiment, a method for rectifying an electrical current generated by an energy source may have the steps of: applying the electrical current to a first circuit including a rectifier bridge and an energy storing element so that the rectifier bridge conducts the electrical current to an output of the rectifier bridge along a first rectification path associated with a first current flow direction of the electrical current; detecting a first specific pattern in a sense signal associated with the electrical current; reconfiguring the rectifier bridge, in response to detecting the first specific pattern, by switching a controllable switching element of the rectifier bridge from a non-conducting state to a conducting state so that the electrical current is conducted within the rectifier bridge along a first inversion path that short-circuits a second circuit including the energy storing element and the energy source and bypasses an output of the rectifier bridge; and reconfiguring the rectifier bridge or allowing the rectifier bridge to perform a self-reconfiguration in response to a change of the current flow direction from the first current flow direction to a second current flow direction so that the rectifier bridge conducts the electrical current to the output of the rectifier bridge along a second rectification path associated with the second current flow direction.

According to another embodiment, a rectifier circuit may have: a pair of input terminals; a pair of output terminals; a first circuit interconnecting the pair of input terminals, the first circuit including an energy storing element and a rectifier bridge, wherein the rectifier bridge includes at least one controllable switching element per bridge branch, wherein an output of the rectifier bridge supplies the pair of output terminals and wherein the at least one controllable switching element per bridge branch is configured to provide a temporary conducting path via the rectifier bridge which bypasses the pair of output terminals and which short-circuits a series connection of the energy storing element and an energy source connectable to the pair of input terminals.

According to another embodiment, a method for rectifying an electrical current generated by an energy source may have the steps of: applying the electrical current to a first circuit including a rectifier bridge and an energy storing element so that the rectifier bridge conducts the electrical current to an output of the rectifier bridge along a first rectification path associated with a first current flow direction of the electrical current; detecting a first specific pattern in a sense signal determined on the basis of the electrical current; reconfiguring the rectifier bridge, in response to detecting the first specific pattern, by switching a controllable switching element of the rectifier bridge from a non-conducting state to a conducting state so that the electrical current is conducted within the rectifier bridge along a first inversion path that short-circuits a series connection of the energy storing element and the energy source, wherein the first inversion path bypasses an output of the rectifier bridge; and reconfiguring the rectifier bridge or allowing the rectifier bridge to perform a self-reconfiguration in response to a change of the current flow direction from the first current flow direction to a second current flow direction so that the rectifier bridge conducts the electrical current to the output of the rectifier bridge along a second rectification path associated with the second current flow direction.

According to another embodiment, a rectifier circuit may have: a pair of input terminals; a pair of output terminals; a first circuit interconnecting the pair of input terminals, wherein the first circuit includes an energy storing element and a rectifier bridge, wherein the rectifier bridge includes parallel bridge branches between a first AC side terminal and a second AC side terminal of the rectifier bridge and at least one controllable switching element per bridge branch, wherein an output of the rectifier bridge supplies the pair of output terminals; wherein the at least one controllable switching element per bridge branch is configured to receive a control signal and to assume, in response to a specific state of the control signal, a conducting state for providing a temporary conducting path via one of the parallel bridge branches of the rectifier bridge including said controllable switching element, the temporary conducting path bypassing the pair of output terminals and short-circuiting a series connection of the energy storing element and an energy source connectable to the pair of input terminals.

The switching elements connect the inductor in parallel to the energy source (e.g., piezoelectric element) during the time that the piezoelectric voltage may be inverted, thereby performing an inversion of the energy source voltage (piezoelectric voltage), i.e. the voltage generated by the energy source. Especially when the inversion of the energy source voltage is performed with a specific timing, for example corresponding to a resonant mode of a resonator formed by the energy source and the (inductive) energy storing element, the power transferred out of the energy source may possibly be significantly increased compared to other AC-DC conversion methods. The load current typically also flows through the inductor. While this fact may add power losses in the inductor it allows the operation of the modified parallel SSHI topology with just two diodes and two switching elements, e.g. MOSFETs (Metal Oxide Semiconductor Field Effect Transistors).

According to further embodiments of the present invention, the energy storing element (or energy storage element) and the rectifier bridge may be connected in series.

The rectifier bridge may be configured to function both as an energy transferring component from the pair of input terminals to the pair of output terminals and as a voltage inverter for the pair of input terminals.

Each bridge branch may comprise a diode component and the at least one controllable switching element.

According to at least some further embodiment of the teachings disclosed herein, the rectifier circuit may further comprise a controller configured to generate at least one control signal for the at least one controllable switching element per bridge branch on the basis of a sense signal indicating a state of the energy source.

The controller may be configured to cause a switching of the at least one controllable switching element from a conducting state to a non-conducting state, or vice versa, upon a detection of a peak in the sense signal.

The energy storing element may form a resonant circuit with the energy source while the second circuit is short-circuited via the rectifier bridge.

According to at least some further embodiments of the teachings disclosed herein the energy storing element is connectable in parallel to the energy source while the second circuit is short-circuited via the rectifier bridge.

According to some further embodiments, the energy source may be a piezoelectric element.

Further embodiments of the present invention provide a converter for synchronized switch harvesting on inductor. The converter comprises a rectifier circuit as described above.

Further embodiments of the present invention provide a method for rectifying an electrical current generated by an energy source. The method comprises applying the electrical current to a first circuit comprising a rectifier bridge and an energy storing element so that the rectifier bridge conducts the electrical current to an output of the rectifier bridge along a first rectification path associated with a first current flow direction of the electrical current. The method further comprises detecting a first specific pattern in a sense signal associated with the electrical current and reconfiguring the rectifier bridge, in response to detecting the first specific pattern, by switching a controllable switching element of the rectifier bridge from a non-conducting state to a conducting state. In this manner, the electrical current is conducted within the rectifier bridge along a first inversion path that substantially short-circuits a second circuit comprising the energy storing element and the energy source and bypasses an output of the rectifier bridge. The rectifier bridge is then again reconfigured or allowed to perform a self-reconfiguration in response to a change of the current flow direction from the first current flow direction to a second current flow direction so that the rectifier bridge conducts the electrical current to the output of the rectifier bridge along a second rectification path associated with the second current flow direction.

With the SSHI converter topology according to the teachings disclosed herein, the number of switching elements such as MOSFETs and diodes employed is reduced in relation to previous SSHI converters and the energy storing element (e.g., an inductor) is at a new location compared to the previous SSHI converters.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
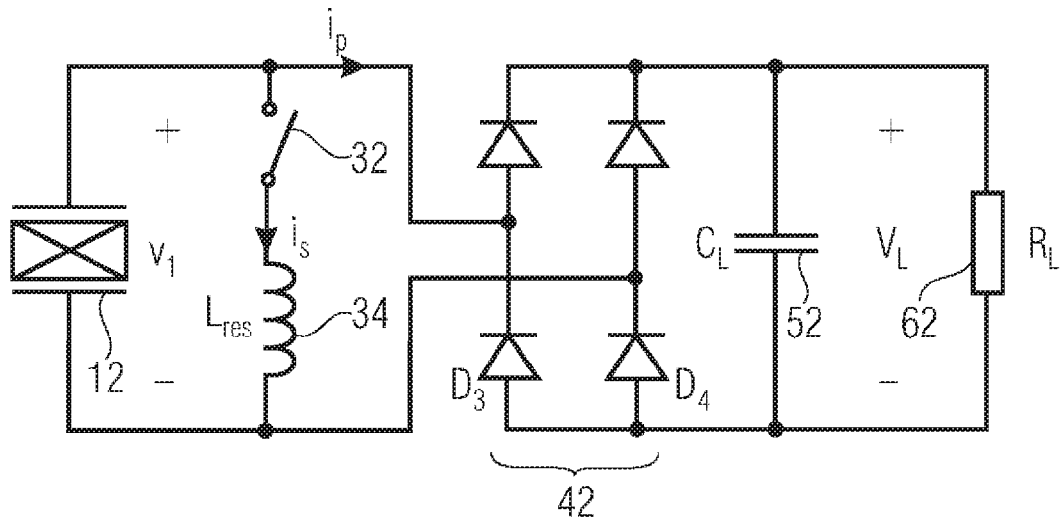
FIG. 1A shows a schematic circuit diagram of a parallel SSHI converter according to conventional technology.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

A rectifier typically may be used when piezoelectric transducers are employed in an energy harvesting power supply for rectifying the AC power. One of the simplest rectifiers is a diode bridge with a filter capacitor. When the absolute value of the piezoelectric voltage is lower than the rectified voltage, no current flows from the piezoelectric element to the load. When the absolute value of the piezoelectric voltage is higher than the rectified voltage, the diodes conduct and the current flows from the piezoelectric element to the output load.

Non-linear converters may also be employed with piezoelectric transducers to increase the harvested energy by active discharge. In comparison, in linear converters, an important part of the charge generated by the piezoelectric element is lost charging and discharging the internal piezoelectric capacitor. In non-linear techniques, when the maximum voltage on the piezoelectric element is achieved, the connection of an inductor to the piezoelectric element causes a resonance, due to the internal capacitor of the piezoelectric element, which results in the inversion of the piezoelectric voltage polarity in a very short time ($t=\pi\sqrt{(LC)}$) compared to the mechanical excitation period. Thus, the inversion of the piezoelectric voltage pursues that piezoelectric current and voltage are in phase, and therefore the operation of the non-linear converter simulates the complex conjugate of the piezoelectric impedance.

There are two SSHI techniques, namely the parallel SSHI technique and the series SSHI technique. In the case of the parallel SSHI technique, shown in FIG. 1A, a switch 32 and an inductor 34 are connected in parallel to a piezoelectric element 12. A diode bridge 42, a filter capacitor 52, and the output load 62 are connected afterwards. The parallel SSHI technique is, for example, described in an article by S. Ben-Yaakov and N. Krihely, "Resonant rectifier for piezoelectric sources", Applied Power Electronics Conference and Exposition, 2005. APEC 2005, pp. 249-253 Vol. 1, 6-10 Mar. 2005.

Figure 1B:
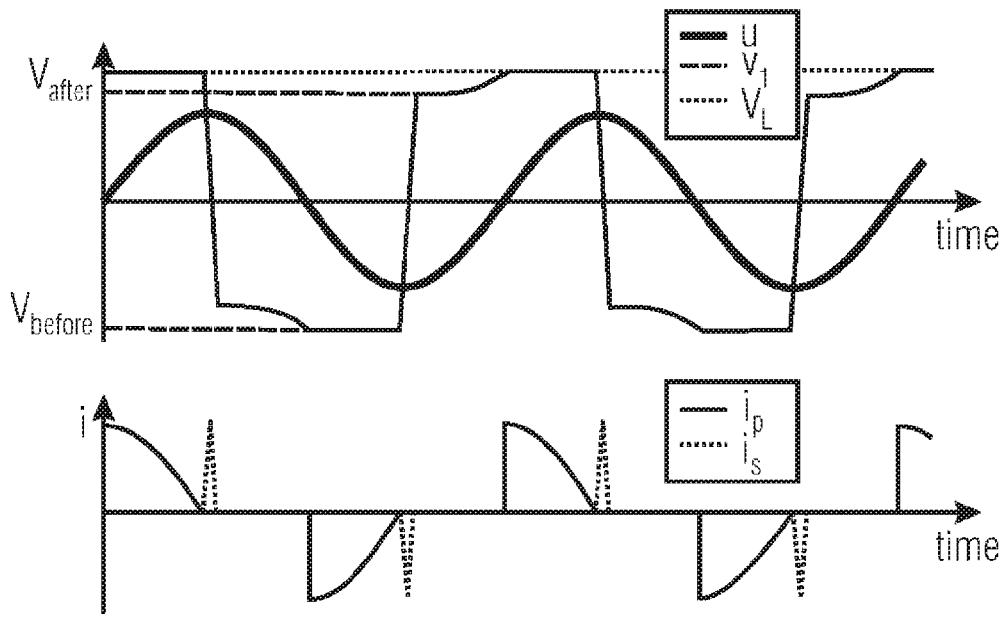
FIG. 1B is a graph illustrating various voltage waveforms, displacement waveform and electrical current waveforms occurring during the operation of the circuit shown in FIG. 1A.

The working principle of the parallel SSHI circuit can be explained using FIG. 1B which shows waveforms at steady state associated to the circuit shown in FIG. 1A. The upper diagram in FIG. 1B shows a piezoelectric displacement u, a piezoelectric voltage $v_1$, and a load voltage $V_L$. When a piezoelectric material is mechanically excited, it transforms the mechanical energy into electrical energy. The AC power available between its electrical terminals has to be rectified to obtain DC power. When a piezoelectric element is in open circuit, the derivative of its voltage $dv_1/dt$ and the derivative of its displacement $du/dt$ are proportional since no electrical current is flowing out of the piezoelectric element, i.e. I=0.

The piezoelectric voltage, the piezoelectric displacement and the electrical current at the piezoelectric element 12 are related as $$I=\alpha du/dt-C_0 dv_1/dt,$$

where I is the electrical current flowing out of the piezoelectric element, u is the piezoelectric displacement, $v_1$ is the piezoelectric voltage, $\alpha$ is the force factor, and $C_0$ is the capacitance of the piezoelectric element.

Figure 3:
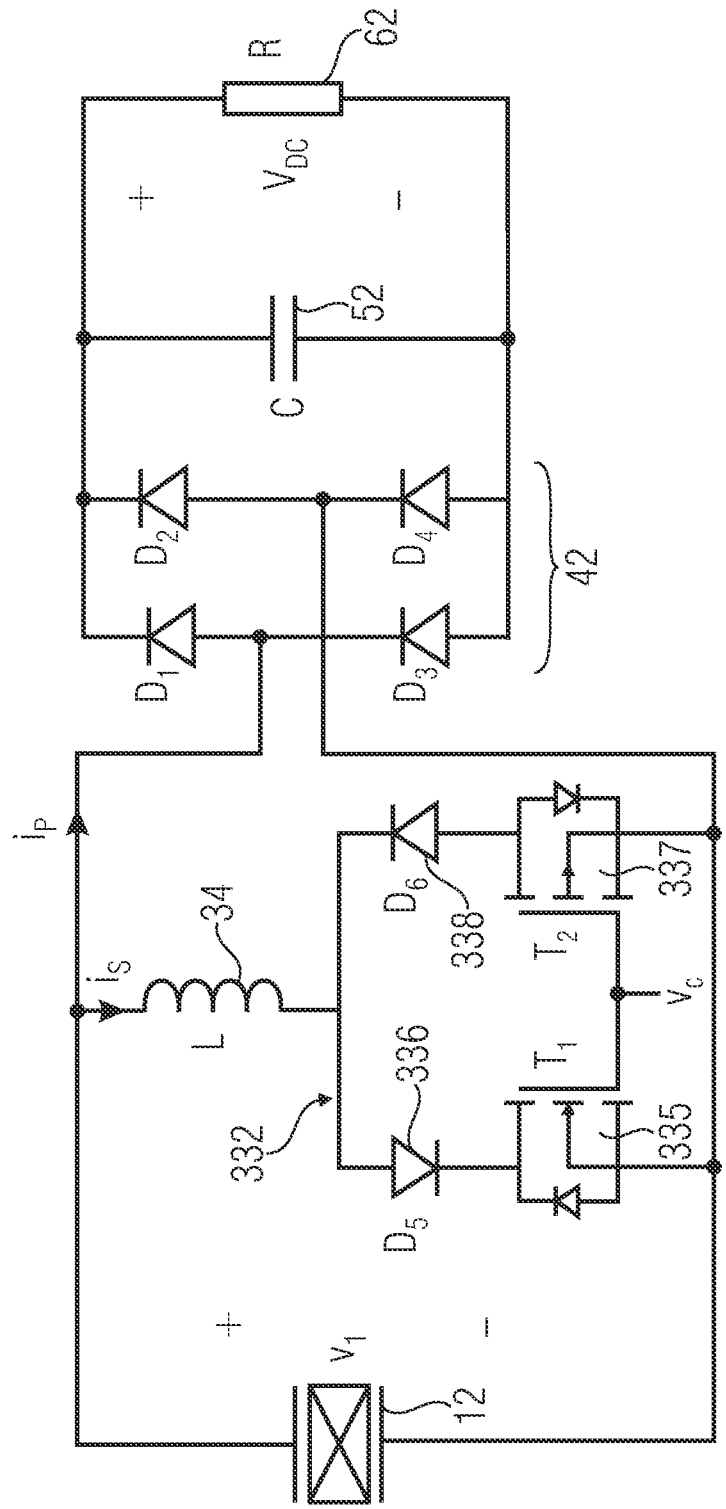
FIG. 3 shows a more detailed schematic circuit diagram of the parallel SSHI converter according to conventional technology.

While the piezoelectric voltage $v_1$ is lower than the rectified voltage, there is no current $i_P$ flowing from the piezoelectric element 12 to the diode bridge 42. Therefore, the derivative of the piezoelectric voltage $dv_1/dt$ and the derivative of the displacement $du/dt$ are proportional. Once the piezoelectric voltage $v_1$ is higher than the rectified voltage plus two times the voltage drop of the diodes, there is current $i_P$ flowing from the piezoelectric element 12 to the diode bridge 42. When the piezoelectric voltage $v_1$ reaches a peak (positive or negative), the switch 32 is closed and current $i_S$ flows from the internal piezoelectric capacitor to the inductor 34. At this moment, a resonant LC circuit is created with the piezoelectric internal capacitor and the voltage on the piezoelectric element changes its polarity in a time $\pi\sqrt{(LC)}$. The current generated by the piezoelectric element flows through the rectifier capacitor 52 and the load 62 when the switch 32 is open and the absolute value of the piezoelectric voltage is higher than the rectified voltage on the load. When the piezoelectric voltage reaches a maximum, the switch 32 is closed. The switch that connects the inductor in parallel with the piezoelectric element is composed by two diodes D5 and D6 and two MOSFETs T1 (NMOS) and T2 (PMOS) as shown in FIG. 3. The current flows through inductor L, D5 and T1 when the piezoelectric element reaches a positive peak voltage whereas the current flows through inductor L, D6 and T2 when the piezoelectric element reaches a negative peak voltage. Once the piezoelectric voltage is inverted, the switch 32 of FIG. 1A is opened again. Since the piezoelectric element 12 is connected most of the time by the diode bridge 42 to the output load 62, it cannot be assumed that when the piezoelectric voltage $v_1$ reaches a peak, the displacement u of the piezoelectric element 12 is maximal. A corresponding parallel SSHI circuit is described by S. Priya and D. J. Inman in "Energy Harvesting Technologies", Springer, 2009, pp. 211-213.

If the piezoelectric voltage and current have the same polarity, the power harvested by the piezoelectric element 12, and therefore the power delivered to the output load 62, is higher than if piezoelectric voltage and current have a phase shift. The fact that piezoelectric voltage and current are in-phase makes possible to emulate the complex conjugate of the piezoelectric impedance as output load.

The piezoelectric equivalent circuit at a given resonant frequency can be represented by an internal sinusoidal current source and a capacitor in parallel (in S. Ben-Yaakov and N. Krihely, "Resonant rectifier for piezoelectric sources", Applied Power Electronics Conference and Exposition, 2005, APEC 2005, Twentieth Annual IEEE, vol. 1, pp. 249-253, 6-10 Mar. 2005). The current source of the model is proportional to the velocity of the piezoelectric element, and therefore proportional to the derivative of the piezoelectric displacement. Hence, when there is a zero crossing of the sinusoidal current source, the optimum point for maximizing the harvested piezoelectric power takes place. Moreover, when the piezoelectric element 12 is in open circuit, the piezoelectric current source is proportional to the derivative of the piezoelectric voltage. In other words, the multiplication of piezoelectric current and voltage is positive since the SSHI converters invert the piezoelectric voltage through inductor L and this maximizes the output power. Therefore, the piezoelectric voltage and displacement derivatives are proportional (the slopes of both curves have the same sign). However when the piezoelectric power is rectified employing the parallel SSHI circuit, most of the time the piezoelectric element is connected to the output load, and therefore the derivative of the piezoelectric voltage and the derivative of the displacement are not anymore proportional. Thus, it cannot be assured that the zero-crossing of the piezoelectric current source occurs at the piezoelectric voltage peak which maximizes the harvested power. Nevertheless, for the case of the series SSHI, the piezoelectric element is usually in open circuit and this fact causes the zero-crossing of the internal piezoelectric source to occur during the piezoelectric voltage inversion and the multiplication of piezoelectric voltage and current to be positive, increasing the harvested power.

Figure 2A:
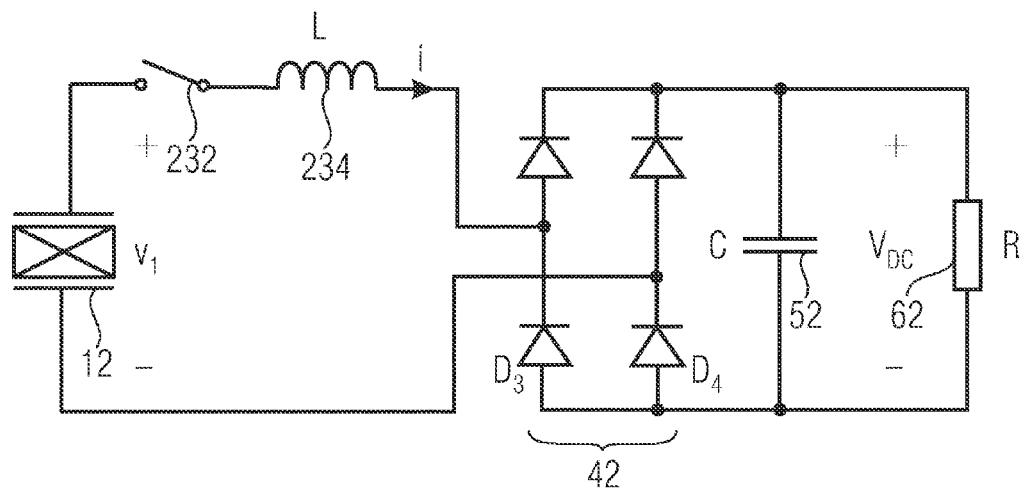
FIG. 2A shows a schematic circuit diagram of a series SSHI converter according to conventional technology.
Figure 2B:
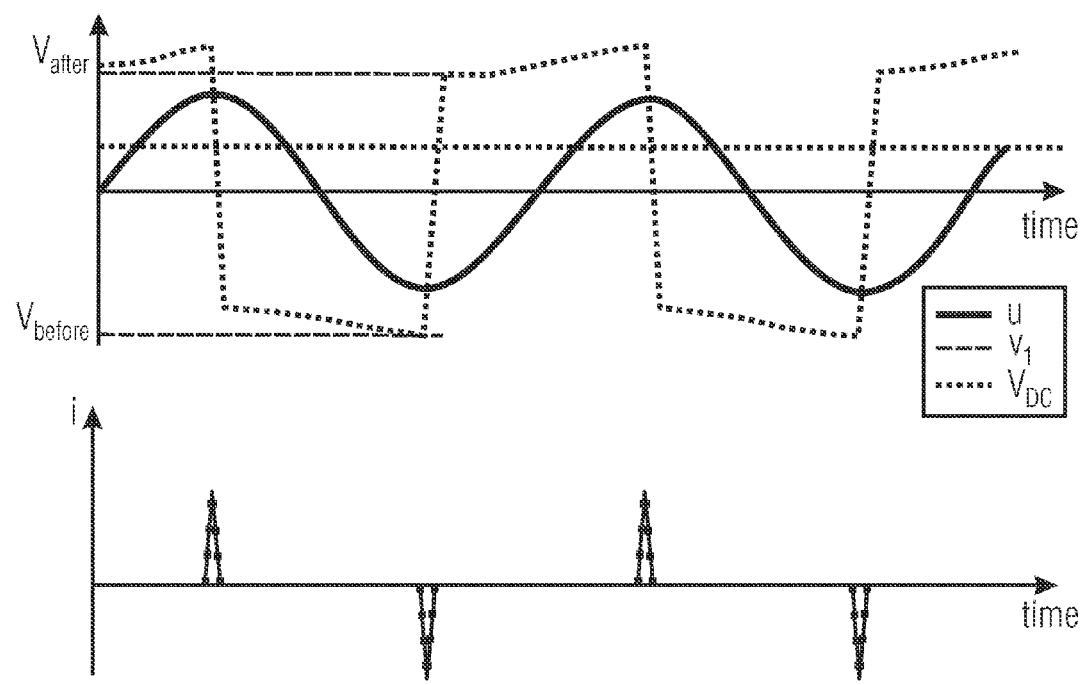
FIG. 2B is a graph illustrating various voltage waveforms, displacement waveform and electrical current waveforms occurring during the operation of the circuit shown in FIG. 2A.

In the series SSHI circuit, which is illustrated in FIG. 2A, the inductor 234 and the switch 232 are connected in series to the piezoelectric element 12 and the diode bridge 42 and filter capacitor 52. As can be seen in FIG. 2B, in the case of the series SSHI circuit there is no current i flowing from the piezoelectric element 12 to the load 62 except when the switch 232 is closed, as stated in "Energy Harvesting from Ambient Vibrations and Heat", by D. Guyomar, G. Sebald, S. Pruvost, M. Lallart, A. Khodayari and C. Richard, Journal of Intelligent Material Systems and Structures, vol. 20, no. 5, pp. 609-624, March 2009. While the switch 232 is open, the derivative of the piezoelectric voltage and displacement are proportional and the piezoelectric internal capacitor is charged. Once the piezoelectric displacement u reaches an extreme, the switch 232 is closed and the current i flows from the piezoelectric element 12 to the output load 62 through the inductor 234 and the diode bridge 42. Since the series connection of the inductor with the piezoelectric element creates a resonating circuit, the piezoelectric voltage is inverted. Afterwards, the switch is opened again. Prior to opening the switch 232 the piezoelectric voltage $v_1$ has a magnitude of $V_{before}$ and subsequent to closing the switch 232 (and accordingly subsequent to the inversion of the piezoelectric voltage $v_1$ and a phase during which the current i flows) the piezoelectric voltage has a magnitude of $V_{after}$, with $|V_{before}|>|V_{after}|$. The output voltage $V_{DC}$ at the filter capacitor is also illustrated in FIG. 2B.

Figure 4:
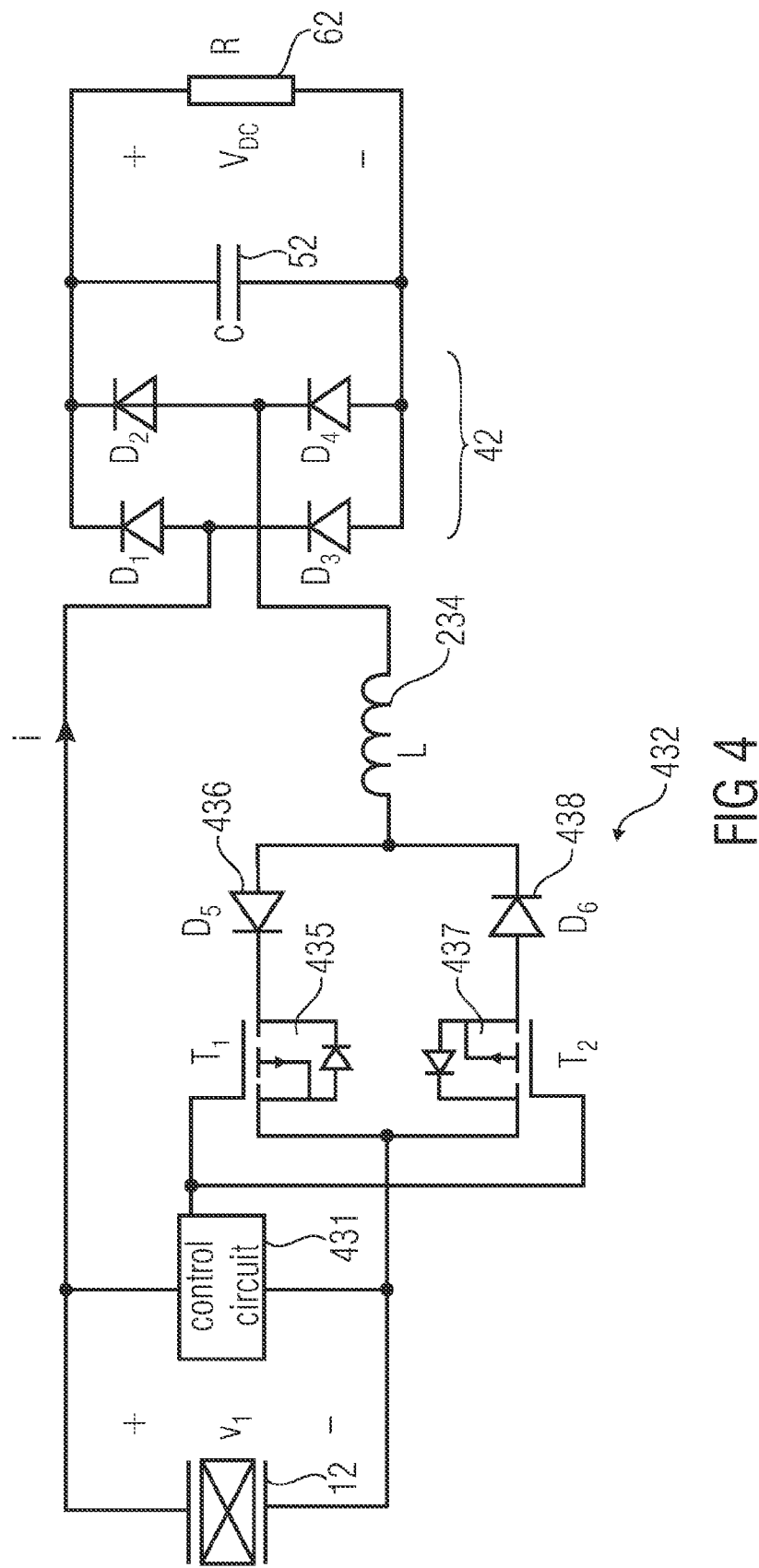
FIG. 4 shows a more detailed schematic circuit diagram of the series SSHI converter according to conventional technology.

Both the parallel and series SSHI circuits need a diode bridge for rectifying the AC power harvested by the piezoelectric elements in addition to a switching circuit for the connection of the inductor to the piezoelectric element. FIGS. 3 and 4 show the detailed circuit of the parallel and series SSHI converters, respectively.

In FIG. 3, the switching circuit 332 comprises two transistors 335, 337 and two diodes 336, 338 in two parallel branches, each branch comprising a series connection of a transistor and a diode. The transistor 335 (T1) is an N-channel metal-oxide-semiconductor (NMOS) field effect transistor (enhancement type) and the transistor 337 (T2) is a P-channel metal-oxide-semiconductor (PMOS) field effect transistor (enhancement type). The diode 336 (D5) is connected in series to the NMOS field effect transistor 335 and allows a current flow in a first direction, only. The diode 338 (D6) is connected in series to the PMOS field effect transistor 337 and allows a current flow in a second direction, only. The NMOS field effect transistor 335 comprises a gate and also the PMOS field effect transistor comprises a gate. Both gates of the transistors T1 and T2 receive the same control signal $v_c$. In dependence on the control signal $v_c$ either one of the two transistors T1, T2 is in a conducting state while the other transistor is in the blocking state.

In FIG. 4 which shows a detailed schematic circuit diagram of the series SSHI converter, the switching circuit 432 comprises two transistors 435, 437 and two diodes 436, 438. As with the switching circuit 332 for the parallel SSHI converter the switching circuit 432 for the series SSHI converter comprises two parallel branches, each branch comprising a series connection of a transistor and a diode. The transistor 435 (T1) and the diode 436 (D5) are connected in series in a first branch. The transistor 437 and the diode 438 are connected in series in a second branch. The transistors 435, 437 are controlled by a control signal provided by a control circuit 431. The control circuit 431 causes one transistor to be in a conducting state while the other transistor is in a blocking state. The diodes 436 and 438 prevent a current flow in an undesired direction after the piezoelectric inversion has taken place while the corresponding transistor is in the conducting state.

In the configurations shown in FIGS. 1A, 2A, 3, and 4, the diode bridge 42 comprises a first bridge branch and a second bridge branch. Furthermore, each bridge branch comprises a first section and a second section with an output of the bridge being tapped between the first and second sections of the first bridge branch and the second bridge branch, respectively. With the configurations shown in FIGS. 1A, 2A, 3, and 4 (and with commonly used diode bridge configurations in general), the first section of a particular bridge branch is typically conductive while the second section of the same bridge branch is typically non-conductive, or vice versa, so an electrical current flowing through a first section is conducted through the load connected to the output of the rectifier circuit and continues along the second section of the second bridge branch. In other words, with these configurations it is avoided that the first section and the second section of the same bridge branch are concurrently conductive as this would short-circuit the AC side of the bridge. With a diode bridge this condition is fulfilled substantially automatically because with a given input voltage only one of the diodes within the first and second sections of a particular branch may become conductive.

Figure 5:
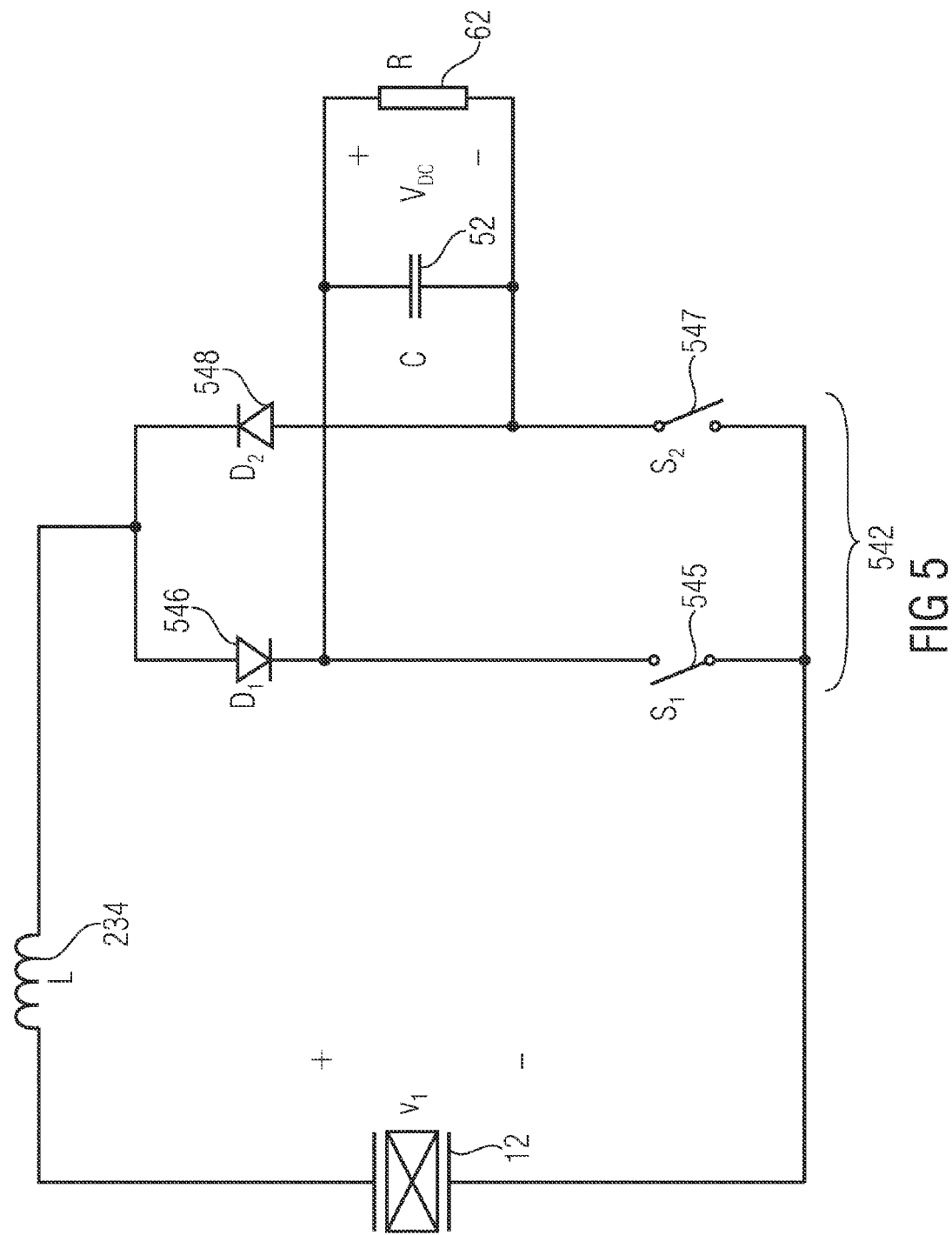
FIG. 5 shows a schematic circuit diagram of a modified series SSHI converter for low output voltages.

FIG. 5 shows a new version of the series SSHI converter which is illustrated and described in M. Lallart and D. Guyomar, "An optimized self-powered switching circuit for non-linear energy harvesting with low voltage output", Smart Materials and Structures, vol. 17, pp. 035030, 2008. In comparison to the series SSHI converter shown in FIG. 4, the functionality of the switching circuit 432 in FIG. 4 is provided by the bridge 542 in the configuration shown in FIG. 5. The bridge 542 comprises two switching elements 545 ($S_1$) and 547 ($S_2$). Furthermore, the bridge comprises two diodes 546 ($D_1$) and 548 ($D_2$). Compared to the series SSHI converter shown in FIG. 2, the circuit in FIG. 5 consists in separating the maximum and minimum detection switches and replacing the diodes $D_3$ and $D_4$ by these switches. Thus, the circuit shown in FIG. 5 includes less components, thus reducing the cost and the dimensions of the circuit. Another benefit is the removal of the diodes that induce voltage gaps. Therefore, losses introduced by such voltage gaps in the harvesting circuit are limited and the harvested power is greater. The energy transfer from the energy source to the rectifier output is done in a (very) short time at the positive peak or at the negative peak of the input voltage. The inversion of the voltage occurs concurrently during this short time. The piezoelectric element is left in open circuit (S1 and S2 open) for the rest of the time.

Figure 6:
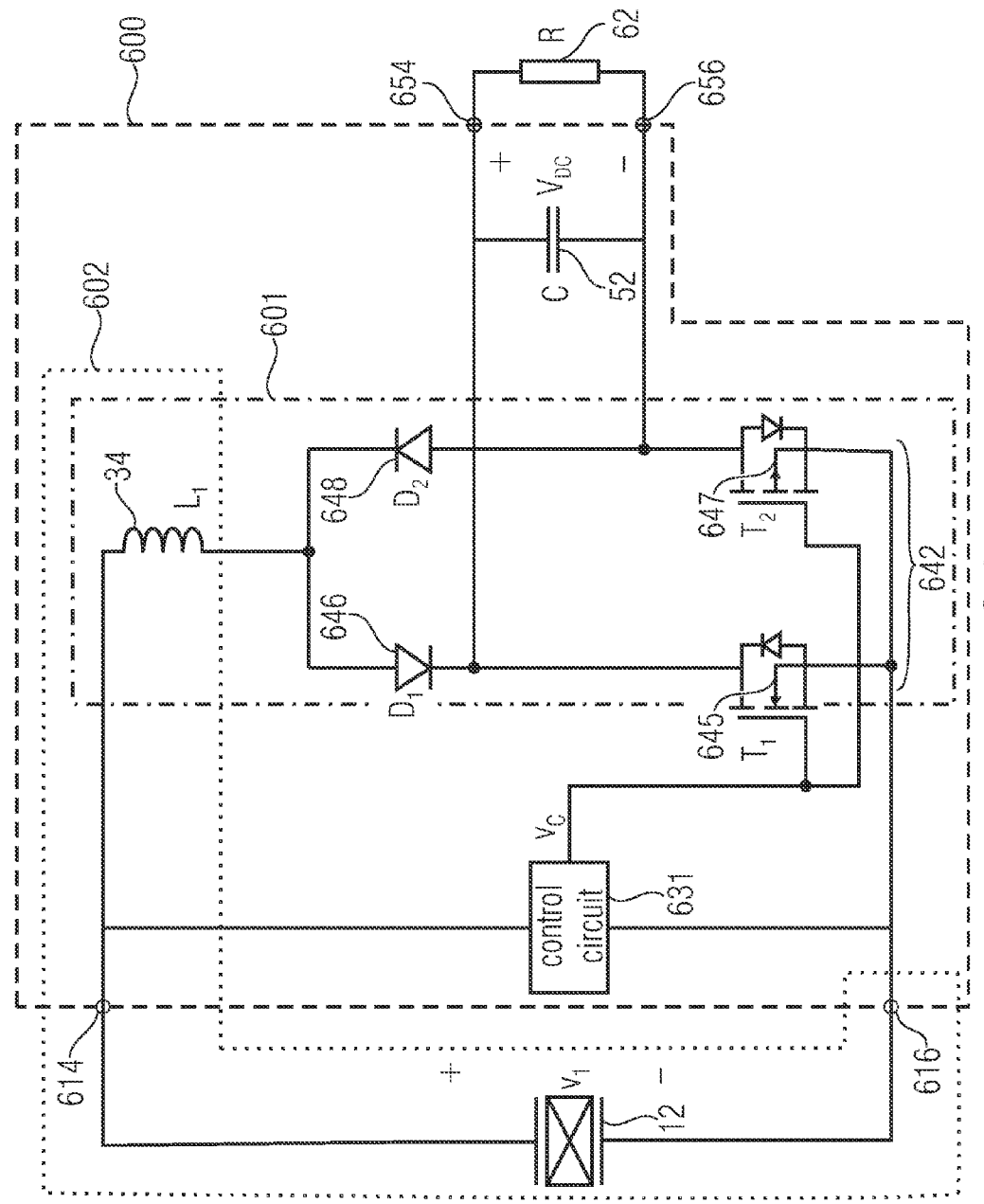
FIG. 6 shows a schematic circuit diagram of a modified parallel SSHI converter according to the teachings disclosed herein.

FIG. 6 shows a schematic circuit diagram of a parallel SSHI converter or rectifier circuit 600 according to at least one embodiment of the teachings disclosed herein. According to the teachings disclosed herein a novel SSHI topology is presented where the number of MOSFETs (or switching elements in general) and/or diodes employed is reduced in relation to the previous SSHI converters and the inductor is at a new location.

The parallel SSHI converter 600 shown in FIG. 6 comprises a pair of input terminals 614, 616, an energy storing element 34, a rectifier bridge 642, the filter capacitor 52, and a pair of output terminals 654, 656. However, the filter capacitor 52 is not necessarily part of the parallel SSHI converter 600 but could be an additional component or integrated with the load 62. The bridge 642 comprises two parallel bridge branches between a first AC side terminal and a second AC side terminal of the bridge. Each of the two bridge branches comprises a controllable switching element. Accordingly a first bridge branch comprises an NMOS transistor 645 (T1) as the controllable element. A second bridge branch comprises a PMOS transistor 647 (T2) as the controllable switching element. Both controllable switching elements 645, 647 receive a control signal $v_c$ from a control circuit 631. As the first controllable switching element 645 is, in the depicted embodiment, an NMOS transistor and the second controllable switching element 647 is a PMOS transistor, the two controllable switching elements react differently to the control signal $v_c$. The first bridge branch further comprises a diode 646 which is connected in series to the first controllable switching element 645. The second bridge branch further comprise a diode 648 which is connected in series to the second controllable switching element 647. In alternative embodiments, the diodes 646 and 648 could be replaced with further controllable switching elements.

The energy storing element may be an inductor 34 and is connected to a first input terminal 614 of the pair of input terminals 614, 616 and to the first AC side terminal of the bridge. The second AC side terminal of the bridge is connected to the second input terminal 616 of the pair of input terminals. Thus, a first circuit 601 interconnecting the pair of input terminals is formed.

Both bridge branches comprise output nodes that are connected to one of the pairs of output terminals 654, 656. The output nodes are between the controllable switching elements and the other switching elements (i.e., the diodes) of the bridge branches. Accordingly, the output node of the first bridge branch is connected to the output terminal 654 and the output node of the second bridge terminal is connected to the output terminal 656 of the parallel SSHI converter 600 according to the embodiment of FIG. 6 of the teachings disclosed herein. A parallel circuit comprising the filter capacitor 52 and the output load 62 extends between the first output terminal 654 and the second output terminal 656.

The two controllable switching elements 645, 647 of the rectifier bridge enable a low-ohmic connection (substantially a short-circuit) between the pair of input terminals 614, 616 to be formed via the first bridge branch or the second bridge branch. In this manner, a second circuit 602 comprising the energy storing element 34, the pair of input terminals 614, 616, and the energy source 12 (e.g., the piezoelectric element) may be substantially short-circuited and the energy storing element 34 is connected in parallel to the energy source 12. Accordingly, the rectifier circuit 600 may be regarded as a parallel SSHI converter. Note that the energy storing element 34 is considered to be a part of the first circuit 601 and also of the second circuit 602. The grouping of several elements within the first circuit 601 and the second circuit 602 is done for explanatory purposes so that is becomes more readily clear, which components are affected by, for example, a substantial short-circuit caused by the rectifier bridge.

The modified parallel SSHI topology according to the embodiment shown in FIG. 6 is just composed by two diodes and two MOSFETs which reduce the voltage drops of the diodes and MOSFETs with respect to the Parallel and Series SSHI circuits depicted in FIGS. 1 to 4. Since two diodes of the rectifier bridge have been substituted by two active MOSFETs, the power harvested by the modified parallel SSHI has increased in comparison with the other SSHI topologies. Moreover, no further diode or transistors are required which increases the efficiency as well. The use of the modified parallel SSHI topology not only harvests more power from the piezoelectric element but also broadens the frequency bandwidth of the converter compared with the other SSHI converter circuits.

The topologies of the modified series SSHI converter shown in FIG. 5 and of the rectifier circuit 600 of FIG. 6 are somewhat similar, but they are controlled in different manners and therefore their operations are different. In particular, the SSHI converter shown in FIG. 5 is a series converter which basically still has the same shortcomings as the series SSHI converters shown in FIGS. 2A and 4. In contrast, the rectifier circuit 600 shown in FIG. 6 acts as a parallel SSHI converter.

In the modified parallel SSHI converter 600, the load current is also flowing through the inductor 34. This fact adds power losses in the inductor 34 but allows the operation of the modified parallel SSHI topology with just two diodes and two MOSFETs.

A converter for synchronized switch harvesting on inductor (SSHI converter) may comprise a rectifier circuit 600 according to the above description. An energy harvester (power harvester or energy scavenger) converter may comprise the rectification circuit and an energy source such as a piezoelectric element.

In the rectifier circuit 600, the inversion of the source voltage 12 is done in a short time. The energy transfer from the energy source 12 to the output of the rectifier bridge 642 is done in between these short inversion times. Accordingly, the rectifier circuit 600 is configured to perform the inversion of the source voltage at a different time (during a different phase of a rectification cycle) than the rectification of the source voltage. In this manner, the energy source 12 is usually connected in a closed circuit: be it in a rectification circuit comprising the load 62, the filter capacitor 52, and two diagonal elements of the rectification bridge 642, or be it in an inversion circuit that bypasses the filter capacitor 52 and the load 62. In other words, the energy source 12 is substantially never in open circuit during operation.

Figure 7A:
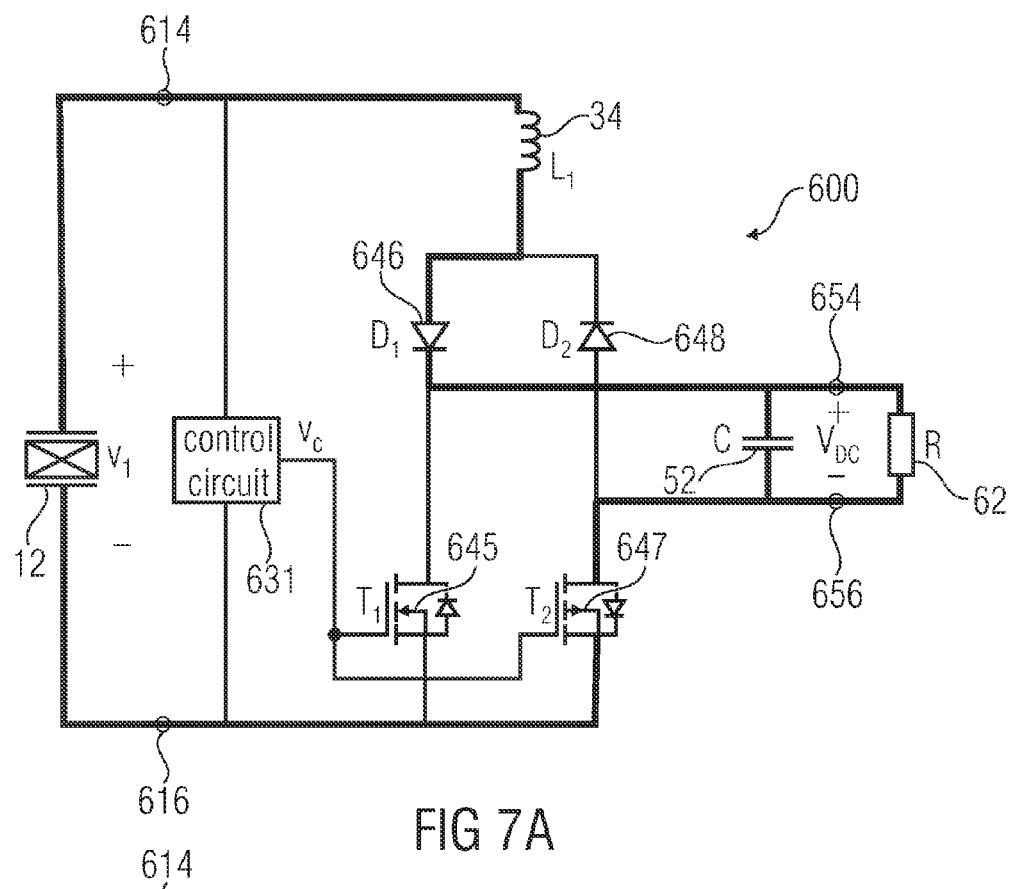
FIGS. 7A to 7D show the schematic circuit diagram during four different phases of operation.
Figure 7B:
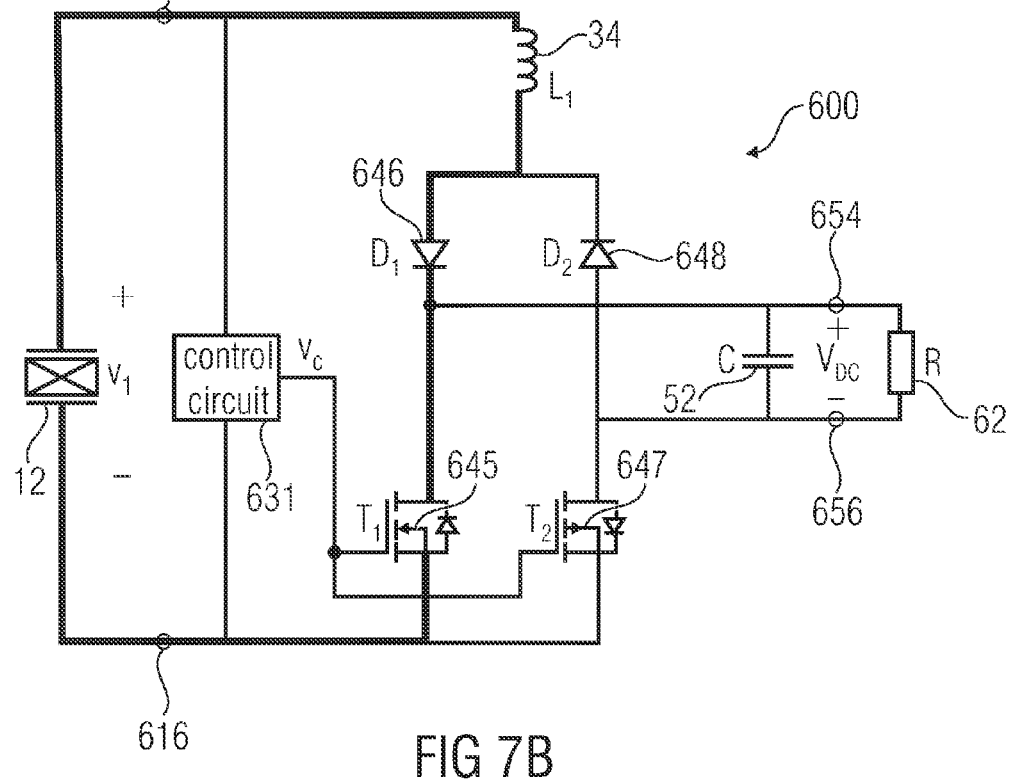
Figure 7C:
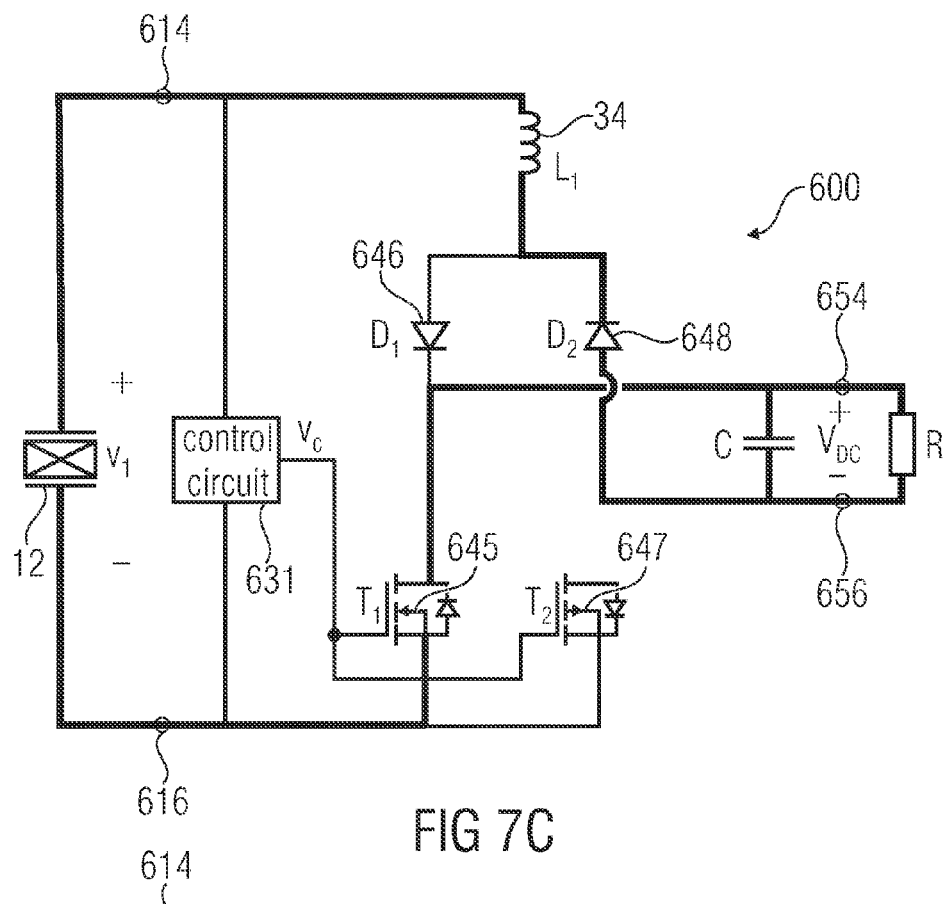
Figure 7D:
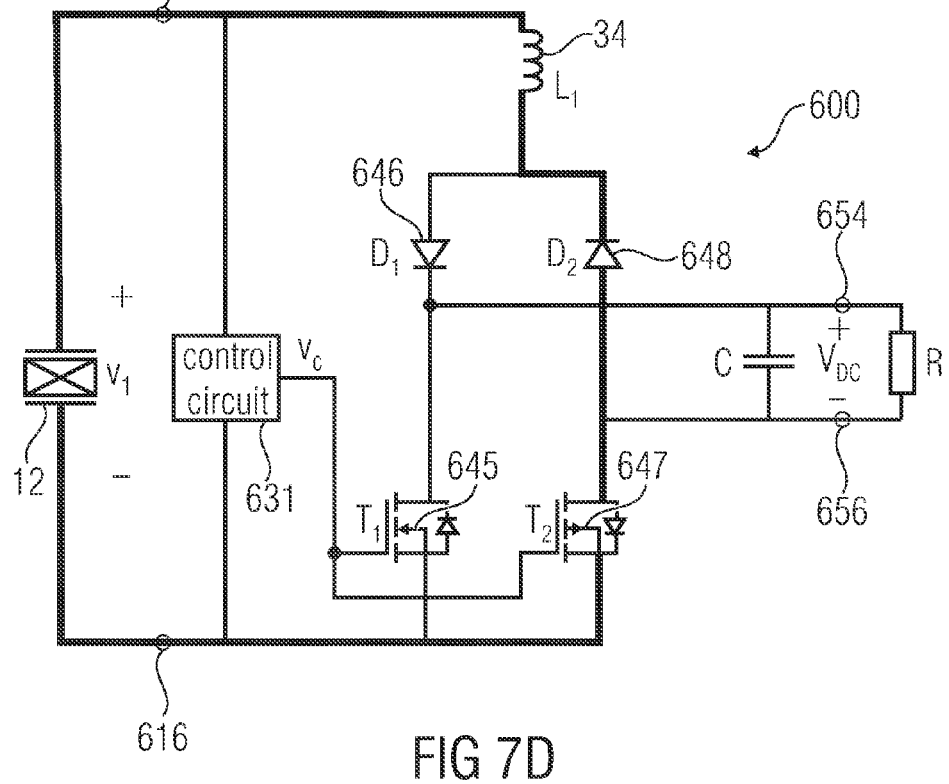

FIGS. 7A to 7D illustrate the rectifier circuit 600 in four different phases of operation. FIGS. 7A and 7C show rectifying or rectification phases of the operation of the rectifier circuit and FIGS. 7B and 7D show inversion phases of the operation of the rectifier circuit.

In FIG. 7A, the piezoelectric element 12 currently generates a piezoelectric voltage $v_1$ that is positive and greater (regarding the magnitude) than a rectified voltage at the filter capacitor 52 plus the voltage gap of one diode and a possible voltage drop over a controllable switching element. The controllable switching element 647 (p-channel MOSFET) is controlled to be in a conducting state by the control circuit 631 and the control signal $v_c$ which has a negative polarity during this phase. This fact and the fact that the piezoelectric voltage $v_1$ is greater than the rectified voltage causes the diode 646 ($D_1$) to become conductive so that a current path is formed, the current path starting from a first terminal of the piezoelectric element 12 via the first input terminal 614, the energy storing element or inductor 34, the diode 646 ($D_1$), the filter capacitor 52 and the load 62, the controllable switching element 647, and the second input terminal 616 back to a second terminal of the piezoelectric element 12. The electrical current thus charges the filter capacitor 52.

When the piezoelectric voltage $v_1$ reaches its positive peak, diode 646 ($D_1$) conducts and the control signal $v_c$ changes its polarity from negative to positive. Thus, the p-channel MOSFET 647 stops conducting (i.e., turns off) and the n-channel MOSFET 645 starts conducting, thereby connecting the inductor 34 in parallel to the piezoelectric element 12, as can be seen in FIG. 7B. FIG. 7B illustrates a second phase of the operation of the rectifier circuit 600 during which an inversion of the piezoelectric voltage $v_1$ is performed. The inversion is made possible by the formation of a resonant circuit due to the parallel connection of the internal capacitance of the piezoelectric element 12 and the inductor 34. In other words, during the second phase of the operation of the rectifier circuit 600 a temporary conducting path via the rectifier bridge is formed along a first bridge branch comprising the diode 646 ($D_1$) and the n-channel MOSFET 645 ($T_1$). In particular, the temporary conducting path is formed along the first bridge branch comprising the n-channel MOSFET 645 and the diode 646. The temporary conducting path substantially bypasses the pair of output terminals 654, 656 and substantially short-circuits the second circuit 602 which comprises the energy storing element 34 (i.e., the inductor), the pair of input terminals 614, 616, and the energy source 12 (i.e., the piezoelectric element) that is connectable to the pair of input terminals 614, 616.

Once the inversion is completed and the piezoelectric voltage $v_1$ reaches a negative peak value, diode 646 ($D_1$) does not conduct anymore and the diode 648 ($D_2$) starts conducting (FIG. 7C). During the rectification phase of the negative semi-cycle, $D_2$ and $T_1$ conduct.

FIG. 7D illustrates a further phase of the operation of the rectifying circuit, namely an inversion phase of the negative semi-cycle. When the piezoelectric voltage $v_1$ reaches its negative peak, the control circuit 631 causes the control signal $v_c$ to change its polarity from positive to negative. Thus, the n-channel MOSFET 645 stops conducting and the p-channel MOSFET 647 starts conducting again connecting the inductor 34 in parallel to the piezoelectric element 12. During the inversion phase of the negative semi-cycle the second bridge branch comprising the p-channel MOSFET 647 ($T_2$) and the diode 648 ($D_2$) form a temporary conducting path via the rectifier bridge 642 which substantially bypasses the output terminals 654, 656 and which substantially short-circuits the second circuit 602 (see FIG. 6). Once the inversion is completed and the piezoelectric voltage $v_1$ reaches a positive value, diode 646 ($D_1$) starts conducting and the cycle starts over again with the rectification phase of the positive semi-cycle as illustrated in FIG. 7A. During the rectification phase of the positive semi-cycle, the diode 646 ($D_1$) and the p-channel MOSFET 647 ($T_2$) conduct.

The control circuit is configured to sense the piezoelectric voltage $v_1$ and to generate the control signal $v_c$ on the basis of the sensed piezoelectric voltage $v_1$. For example, the control circuit may be configured to detect local maxima and local minima of the piezoelectric voltage $v_1$ and the control signal $v_c$ may be switched from a positive level to a negative level upon detection of a local maximum or minimum, or vice versa.

During the rectification of the AC power, the modified parallel SSHI converter 600 acts as a half-synchronous rectifier since the circuit has two diodes 646, 648 and two MOSFETs 645, 647. Thus, the efficiency during this phase (these phases) is increased with respect to the other existing SSHI topologies. A synchronous rectification of the diodes is also possible employing the control circuit for synchronous rectification that appears in the European patent application 10192761.4 entitled "Diodenersatzschaltung, Aufwärtswandlerschaltung, Abwärtswandlerschaltung and Brückengleichrichterschaltung" of the inventor M. Pollack. Moreover, if the two diodes 646 ($D_1$), 648 ($D_2$) are substituted by two active MOSFETs, the efficiency may increase, in particular if the control circuit 631 consumes relatively little power. A synchronous rectifier may also be selected for the design of an application specific integrated circuit (ASIC) since diodes designed with, for example, some CMOS technologies may have a voltage drop of 1.8V for a continuous reverse voltage of 20 V. Discrete MOSFETs that may offer better efficiency results in SSHI converters are designed for high frequency applications although the vibration frequencies employed for exciting the piezoelectric elements are relatively low, e.g., below 110 Hz. The cause is that when the piezoelectric element is connected in parallel with the inductor through the MOSFET and the diode, a resonant LC circuit is established with a resonant frequency of $2\pi\sqrt{(LC)}$ and the low capacitances associated to high frequency transistors provide better results.

Figure 8:
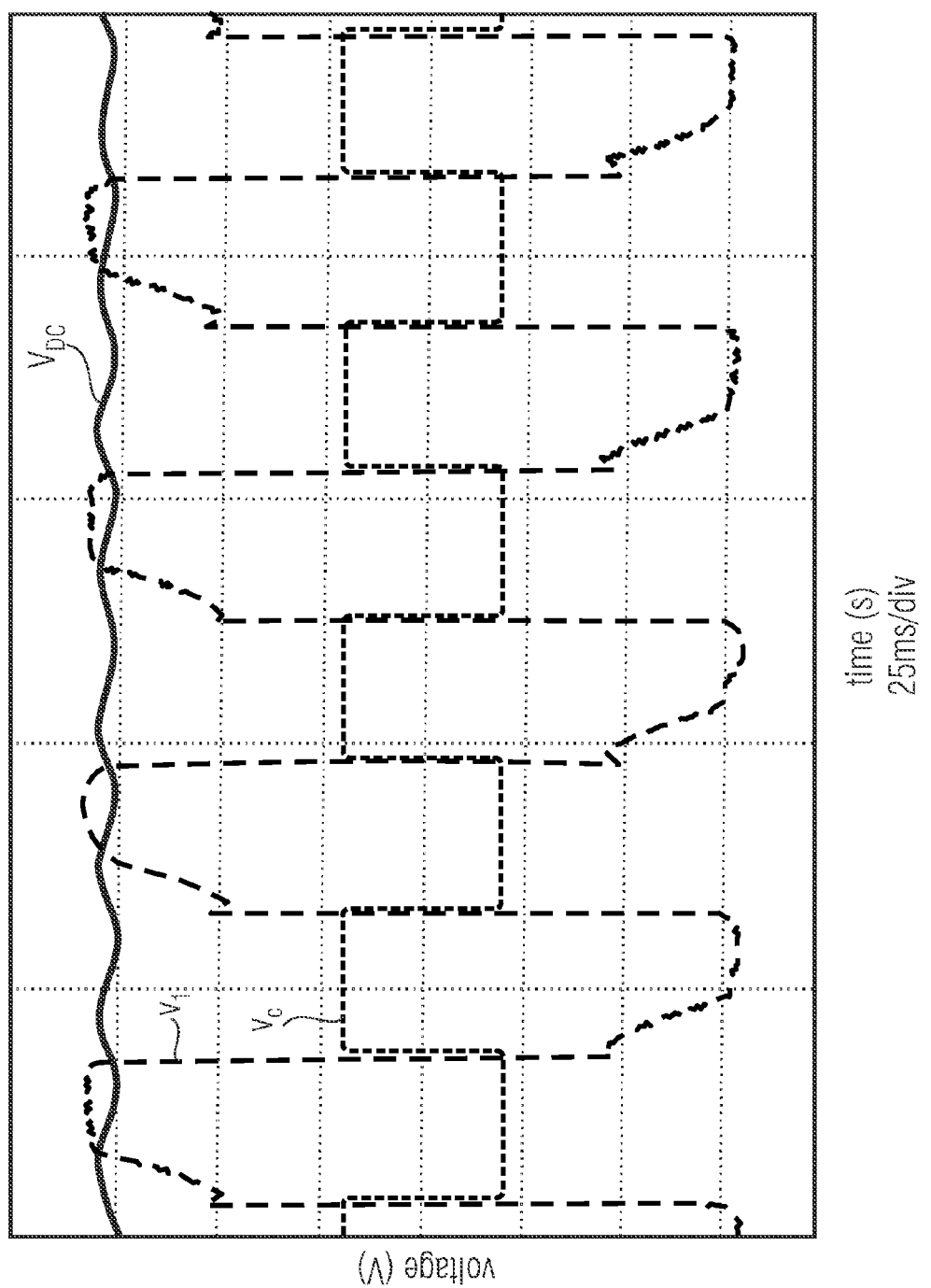
FIG. 8 illustrates steady state waveforms of the modified parallel SSHI converter.

FIG. 8 illustrates three recorded signals of an implemented modified parallel SSHI circuit according to FIG. 6. The piezoelectric voltage $v_1$ is drawn in a dashed line, the control signal $v_c$ for switching MOSFETs T1 and T2 of FIG. 6 is drawn in a dotted line and the rectified voltage $V_{DC}$ at the output of the rectifier circuit 600 is drawn in full stroke. On the voltage axis one division corresponds to 5V and on the time axis one division corresponds to 25 ms. The behavior of the piezoelectric voltage $v_1$ is the same that can be observed by the parallel SSHI converter as illustrated for example in FIGS. 2A and 2B.

When the piezoelectric voltage $v_1$ reaches its positive peak value, diode 646 (D1) conducts and the control signal $v_c$ changes its value from negative to positive. Thus, p-channel MOSFET 647 (T2) does not conduct anymore and n-channel MOSFET 645 (T1) starts conducting. Since D1 and T1 are turned-on, the piezoelectric element 12 is connected in parallel to inductor 34 ($L_1$). Once the inversion is completed and the piezoelectric voltage $v_1$ reaches a negative value, diode D1 does not conduct anymore and diode D2 starts conducting. In this rectification phase of the negative semi-cycle, D2 and T1 conduct. When the piezoelectric voltage $v_1$ reaches its negative peak value, diode D2 conducts and the control signal changes its value from positive to negative. Thus, n-channel MOSFET T1 does not conduct anymore and p-channel MOSFET T2 starts conducting. Since D2 and T2 are turned-on, the piezoelectric element 12 is connected in parallel to inductor L. Once the inversion is completed and the piezoelectric voltage $v_1$ reaches a positive value, diode D2 does not conduct anymore and D1 starts conducting. In this rectification phase of the positive semi-cycle, D1 and T2 conduct.

With respect to alternative embodiments, substantially the same explanation is valid if diodes D1 and D2 are substituted by MOSFETs and controlled as in a synchronous rectifier.

The modified parallel SSHI converter according to the teachings disclosed herein does not need a separate circuit for the connection of the inductor 34 to the piezoelectric element 12 besides the rectifier circuit 642 for the connection of the piezoelectric element 12 to the load 62. Instead just one circuit is employed and performs both functionalities. The modified parallel SSHI converter may utilize just two diodes and two MOSFETs instead of the six diodes and two MOSFETs that may be used by the parallel and series SSHI topologies shown in FIGS. 1A, 2A, 3, and 4. Moreover, the location of the two MOSFETs in the rectifier bridge allows a half synchronous rectification which increases the efficiency of the AC-DC converter. Moreover, the bandwidth of this rectifier is also broader than the bandwidth obtained with the other AC-DC rectifiers.

Figure 9:
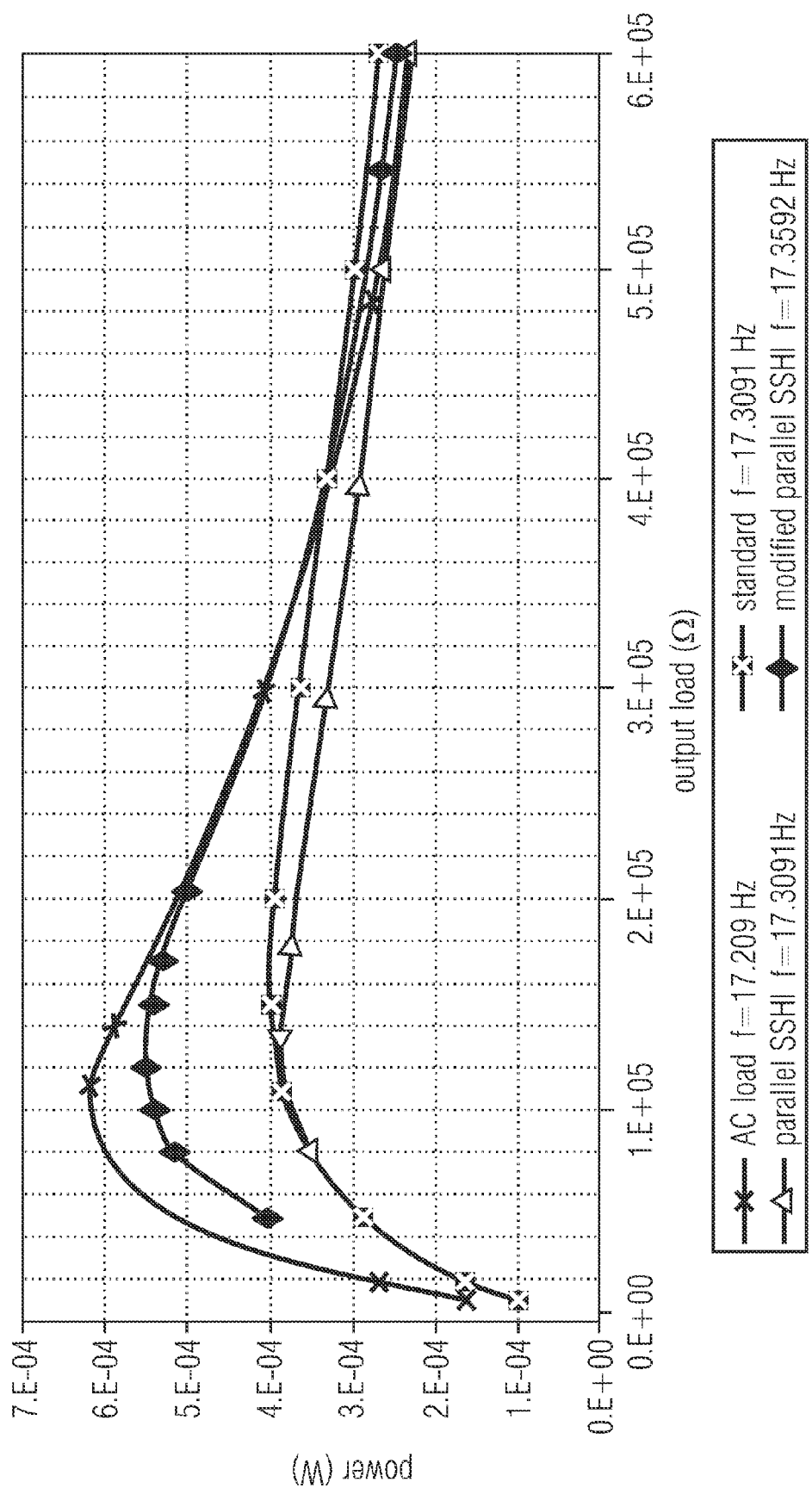
FIG. 9 graphically illustrates the results of measurements of a first selected piezoelectric element connected to various types of converters.
Figure 10:
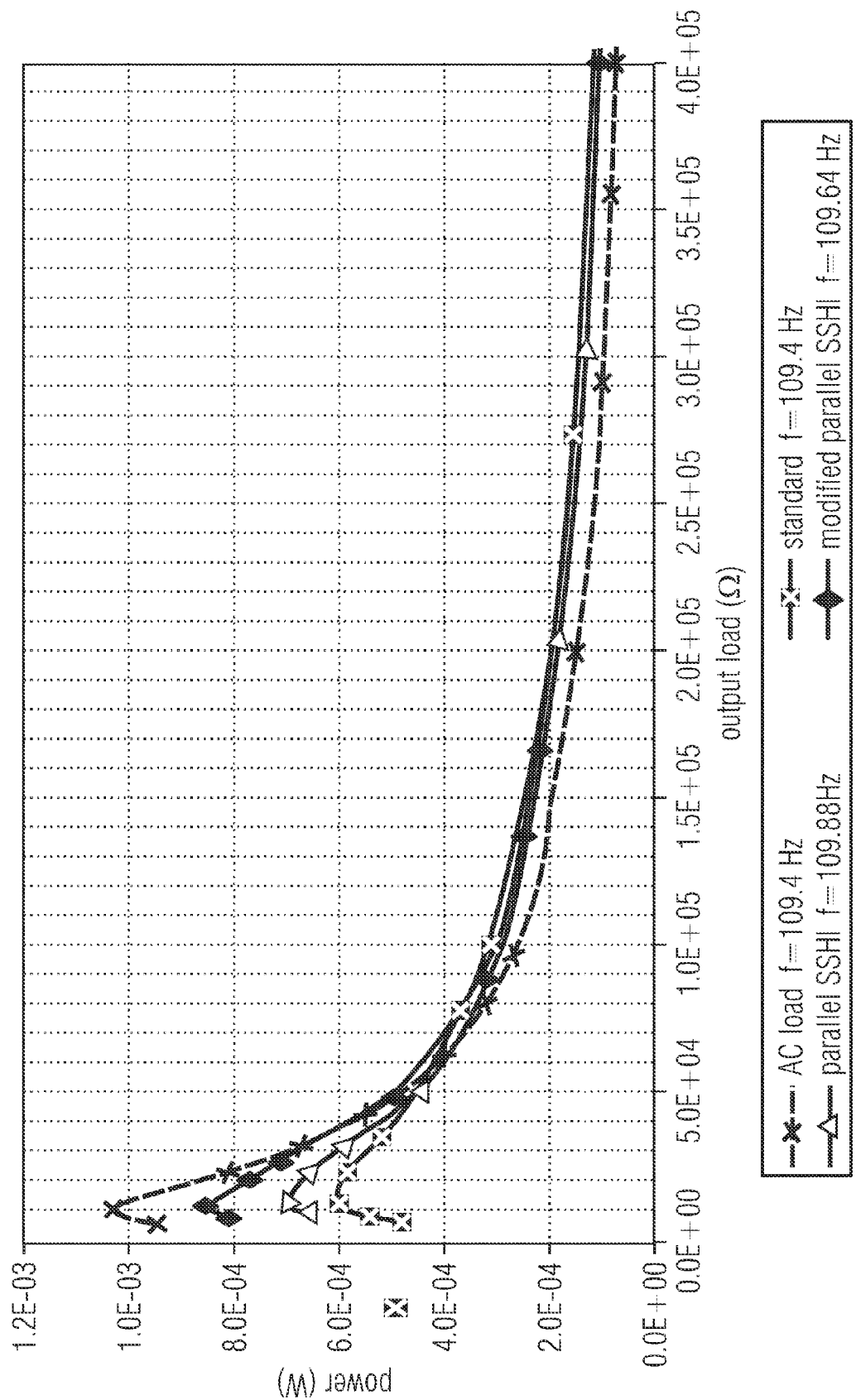
FIG. 10 graphically illustrates the results of measurements of a second selected piezoelectric element connected to various types of converters.

FIGS. 9 and 10 display the harvested power versus output load for the piezoelectric elements DuraAct P-876.A12 and Midé QP20W, respectively. In particular, FIGS. 9 and 10 show different measurements done while a piezoelectric element was excited with sinusoidal vibrations generated by an electromagnetic shaker in order to compare the harvested power of different AC-DC converters (full-wave rectifier, the parallel SSHI and the modified parallel SSHI) as a function of the resistive load connected to the piezoelectric element. The piezoelectric element DuraAct P-876.A12 was excited at 0.1 g while the piezoelectric element Midé QP20W was excited at 1 g. Each graph has four curves. The piezo-electric element 12 is connected directly to a resistive load 62 in the AC curve (black crosses), to the resistive load 62 through a diode bridge in the case of the standard curve (black squares with white crosses), to the resistive load 62 through the parallel SSHI circuit for the case of the parallel SSHI curve (triangles) and through the modified parallel SSHI circuit for the case of the modified parallel SSHI curve (diamonds). The direct connection of the resistive load 62 to the piezoelectric element 12 is provided as a reference because this direct connection does not generate diode-related or switching-element-related losses. Accordingly, a relatively high output power can be obtained using the direct connection, which is, however, an AC power. In FIG. 9 the standard curve (white crosses) and the curve belonging to the conventional-technology parallel SSHI circuit (triangles) show an approximately identical behavior with the standard curve even slightly outperforming the conventional-technology parallel SSHI circuit, in particular for high loads. In FIG. 10 the conventional-technology parallel SSHI circuit (triangles) performs better than the standard circuit (white crosses), at least for small load resistances. In both FIGS. 9 and 10, i.e. for the piezoelectric elements DuraAct P-876.A 2 as well as Midé QP20W, the modified parallel SSHI converter according to the teachings disclosed herein shows superior performance compared to the standard curve and the conventional-technology parallel SSHI converter at least for relatively small load resistances. In FIG. 9, a maximum of the harvested power can be observed for an output load of approximately 120 kOhm for the modified parallel SSHI converter according to the teachings disclosed herein. In FIG. 10, the maximum of the harvested power can be observed for an output load of approximately 10 kOhm.

From the measurements, the results of which are shown in FIGS. 9 and 10, it is deduced that the modified parallel SSHI converter offers better results in terms of efficiency than the parallel SSHI converter employing the same diodes, switching elements and peak detector circuit.

Table 1 below shows the results obtained for another type of piezoelectric element 12, namely the V21BL piezoelectric element with three different rectifier circuits, the standard, the parallel SSHI and the modified parallel SSHI circuit. The piezoelectric element 12 was loaded with a 1 g tip mass, provided with a parallel electrical connection and an acceleration of 1 g. For each rectifier, three different values of power and frequency are given. The second data pair corresponds to the maximum harvested power and the frequency at which it is obtained. The first and the third data points give information about the frequencies at which half of the maximum power is obtained.

TABLE 1

| Standard | | Parallel SSHI | | Modified Parallel SSHI | |
|---|---|---|---|---|---|
| Output Power (mW) | Frequency (Hz) | Output Power (mW) | Frequency (Hz) | Output Power (mW) | Frequency (Hz) |
| 1.28 | 67.31 | 1.19 | 67.07 | 1.25 | 66.6 |
| 2.24 | 68.74 | 2.25 | 68.26 | 2.51 | 68.26 |
| 1.86 | 69.2 | 1.16 | 69.45 | 1.3 | 69.45 |

Table 2 provides a simplification of the information that appears in Table 1 since the normalized power is the harvested power divided by the power obtained with the standard rectifier. The frequency bandwidth is calculated as the difference between the frequencies at which half of the maximum power is extracted.

| Standard | | Parallel SSHI | | Modified Parallel SSHI | |
|---|---|---|---|---|---|
| Normalized Power | Frequency Bandwidth (Hz) | Normalized Power | Frequency Bandwidth (Hz) | Normalized Power | Frequency Bandwidth (Hz) |
| 1 | 1.89 | 1.004 | 2.38 | 1.121 | 2.85 |

Tables 3 and 4 show the normalized version of the measured results obtained for the Midé QP20W and the DuraAct P-876.A 12 piezoelectric elements. For all the cases measured, the modified parallel SSHI circuit is the AC-DC converter that harvests more power.

TABLE 3

| Standard | | Parallel SSHI | | Modified Parallel SSHI | |
|---|---|---|---|---|---|
| Normalized Power | Frequency Bandwidth (Hz) | Normalized Power | Frequency Bandwidth (Hz) | Normalized Power | Frequency Bandwidth (Hz) |
| 1 | 5.23 | 1.276 | 6.42 | 1.383 | 8.32 |

TABLE 4

| Standard | | Parallel SSHI | | Modified Parallel SSHI | |
|---|---|---|---|---|---|
| Normalized Power | Frequency Bandwidth (Hz) | Normalized Power | Frequency Bandwidth (Hz) | Normalized Power | Frequency Bandwidth (Hz) |
| 1 | 0.4506 | 0.972 | 0.4505 | 1.38 | 0.5507 |

From the measurements shown in Tables 1 to 4, it is deduced that the modified parallel SSHI converter offers better results in terms of bandwidth operation than the parallel SSHI converter employing the same diodes, switching elements and peak detector circuit.

According to alternative embodiments of the teachings disclosed herein, a rectifier circuit may comprise a pair of input terminals, a pair of output terminals, an energy storing element, and a rectifier bridge configured to function as a switching circuit for the energy storing element and as a rectifying circuit connecting the energy storing element with the pair of output terminals.

The switching circuit for the energy storing element (e.g., an inductor) may close a resonant circuit formed by the energy storing element and an energy source that is connectable to the pair of input terminals. In this manner, the amount of energy extracted from the energy source may be increased. For example, the piezoelectric voltage of a piezoelectric element acting as the energy source may be inverted by the action of the energy storing element and the switching circuit. When the rectifier bridge functions as the rectifying circuit, the energy stored by the resonance circuit is transferred to the output terminals as a direct current.

The energy source (piezoelectric element), the energy storing element (inductor), and the switching circuit may be connected to each other so that the energy source and the energy storing element are connected in parallel. Accordingly, the rectifier circuit functions as a parallel SSHI converter during the inversion phases and this function classifies the rectifier circuit as a "parallel SSHI converter". During the rectifying phase, that is while the rectifying bridge connects the input terminals (via the energy storing element) with the output terminals in a periodically alternating manner in order to rectify the alternating voltage provided by the energy source, the rectifier circuit may actually have the configuration of a series SSHI converter, because the energy storing element is connected in series between the energy source and the rectifier bridge.

The rectifier bridge may be configured to function in an alternating manner as the switching circuit and the rectifying circuit.

The rectifier bridge may be configured to bypass the pair of output terminals and to provide a short-circuit for the energy storing element and an energy source connected to the pair of input terminals when functioning as the switching circuit.

Figure 11:
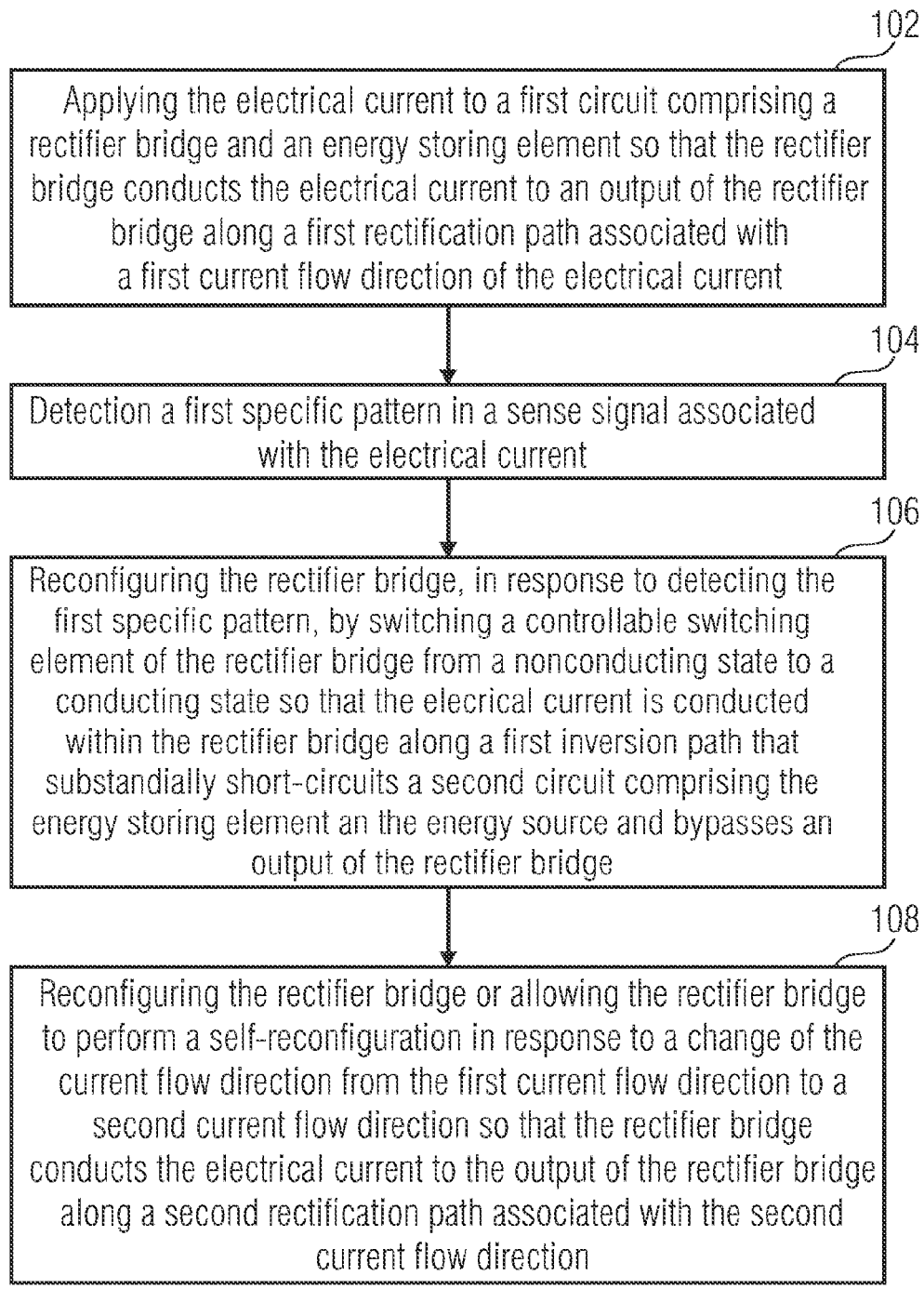
FIG. 11 shows a schematic flow diagram of a method for rectifying an electrical current according to the teachings disclosed herein.

FIG. 11 show a schematic flow diagram of a method for rectifying an electrical current generated by an energy source according to an embodiment of the teachings disclosed herein.

At a step 102 of the method an electrical current is applied to a first circuit 601 (see FIG. 6) comprising a rectifier bridge and an energy storing element so that the rectifier bridge conducts the electrical current to an output of the rectifier bridge along a first rectification path associated with a first current flow direction of the electrical current. Thus, electrical energy is transferred from an input side (AC side) of the rectifying bridge to a an output side (secondary side or DC side) of the rectifying bridge during a first rectifying phase of one cycle of operation.

At a step 104 a first specific pattern is detected in a sense signal associated with the electrical current. For example, the sense signal may be piezoelectric voltage output by a piezoelectric element that also generates the electrical current. The sense signal may be based on a voltage between two input terminals of the rectifier circuit connected to the energy source.

The rectifier bridge may then be reconfigured, as indicated at a step 106, in response to detecting the first specific pattern. The reconfiguration of the rectifier bridge may be achieved by switching a controllable switching element of the rectifier bridge from a non-conducting state to a conducting state so that the electrical current is conducted within the rectifier bridge along a first inversion path that substantially short-circuits a second circuit 602 (see FIG. 6) comprising the energy storing element and the energy source and bypasses an output of the rectifier bridge. This phase of the cycle of operation is an inversion phase because a voltage generated by the energy source is inverted by the energy storing element and the short-circuit caused by the first inversion path.

At a step 108 the rectifier bridge is reconfigured. Alternatively, the rectifier bridge may be allowed to perform a self-reconfiguration in response to a change of the current flow direction from the first current flow direction to a second current flow direction so that the rectifier bridge conducts the electrical current to the output of the rectifier bridge along a second rectification path associated with the second current flow direction.

According to further embodiments of the method for rectifying an electrical current, a second specific pattern may be detected in the sense signal. A third reconfiguration of the rectifier bridge may then be performed, in response to detecting the second specific pattern, by switching the controllable switching element of the rectifier bridge from the conducting state to the non-conducting state so that the electrical current is conducted within the rectifier bridge along a second inversion path that substantially short circuits the second circuit and bypasses the output of the rectifier bridge.

In addition to the controllable switching element mentioned above, the rectifier bridge may comprises a second controllable switching element. The reconfiguration of the rectifier bridge during the step 106 may then further comprise a switching of the second controllable switching element form a conducting state to a non-conducting state. Likewise, the third reconfiguration of the rectifier bridge may comprise a switching of the second controllable switching element from the non-conducting state to the conducting state. Accordingly, the second inversion path employs the second controllable switching element.

The self-reconfiguration of the rectifier bridge may be caused by at least one diode element of the rectifier bridge changing from a non-conducting state to a conducting state, or vice versa. Besides the controllable switching elements, the rectifier bridge may comprises diode elements. The mentioned behavior of the diode element(s) is typically caused by an inversion of the polarity of the voltage at the input of the rectifier bridge so that a diode in a first bridge branch of the rectifier bridge become conducting and another diode in a second bridge branch becomes non-conducting.

According to further embodiments of the teachings disclosed herein, the rectifier bridge may comprise two bridge branches connected in parallel between a first bridge input terminal and a second bridge input terminal, wherein a first bridge branch of the two bridge branches substantially coincides with the inversion path and a second bridge branch of the two bridge branches substantially coincides with the second inversion path.

The rectifier bridge may comprise a second controllable switching element, a third controllable switching element, and a fourth controllable switching element. The method may further comprise controlling the first, second, third, and fourth controllable switching elements individually in response to specific patterns in the sense signal. By controlling the first to fourth controllable switching elements in an individual manner, the rectifying phase(s) and the inversion phase(s) may be timed in a specific manner so that an energy transfer from the energy source to the load is substantially maximized.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A rectifier circuit comprising
a pair of input terminals;
a pair of output terminals;
a first circuit interconnecting the pair of input terminals, the first circuit comprising an energy storing element and a rectifier bridge, wherein the rectifier bridge comprises at least one controllable switching element per bridge branch, wherein an output of the rectifier bridge supplies the pair of output terminals and wherein the at least one controllable switching element per bridge branch is configured to provide a temporary conducting path via the rectifier bridge which bypasses the pair of output terminals and which short-circuits a second circuit comprising the energy storing element, the pair of input terminals, and an energy source connectable to the pair of input terminals.

2. The rectifier circuit according to claim 1, wherein the energy storing element and the rectifier bridge are connected in series.

3. The rectifier circuit according to claim 1, wherein the rectifier bridge is configured to function both as an energy transferring component from the pair of input terminals to the pair of output terminals and as a voltage inverter for the pair of input terminals.

4. The rectifier circuit according to claim 1, wherein each bridge branch comprises a diode component and the at least one controllable switching element.

5. The rectifier circuit according to claim 1, further comprising a controller configured to generate at least one control signal for the at least one controllable switching element per bridge branch on the basis of a sense signal indicating a state of the energy source.

6. The rectifier circuit according to claim 5, wherein the controller is configured to cause a switching of the at least one controllable switching element from a conducting state to a non-conducting state, or vice versa, upon a detection of a peak in the sense signal.

7. The rectifier circuit according to claim 1, wherein the energy storing element forms a resonant circuit with the energy source while the second circuit is short-circuited via the rectifier bridge.

8. The rectifier circuit according to claim 1, wherein the energy storing element is connectable in parallel to the energy source while the second circuit is short-circuited via the rectifier bridge.

9. The rectifier circuit according to claim 1, wherein the energy source is a piezoelectric element.

10. A converter for synchronized switch harvesting on inductor, the converter comprising a rectifier circuit according to claim 1.

11. A method for rectifying an electrical current generated by an energy source, the method comprising:
applying the electrical current to a first circuit comprising a rectifier bridge and an energy storing element so that the rectifier bridge conducts the electrical current to an output of the rectifier bridge along a first rectification path associated with a first current flow direction of the electrical current;
detecting a first specific pattern in a sense signal associated with the electrical current;
reconfiguring the rectifier bridge, in response to detecting the first specific pattern, by switching a controllable switching element of the rectifier bridge from a non-conducting state to a conducting state so that the electrical current is conducted within the rectifier bridge along a first inversion path that short-circuits a second circuit comprising the energy storing element and the energy source and bypasses an output of the rectifier bridge; and
reconfiguring the rectifier bridge or allowing the rectifier bridge to perform a self-reconfiguration in response to a change of the current flow direction from the first current flow direction to a second current flow direction so that the rectifier bridge conducts the electrical current to the output of the rectifier bridge along a second rectification path associated with the second current flow direction.

12. The method according to claim 11, wherein the self-reconfiguration of the rectifier bridge is caused by at least one diode element of the rectifier bridge changing from a non-conducting state to a conducting state, or vice versa.

13. The method according to claim 11, wherein the rectifier bridge comprises two bridge branches connected in parallel between a first bridge input terminal and a second bridge input terminal, wherein a first bridge branch of the two bridge branches coincides with the inversion path and a second bridge branch of the two bridge branches coincides with the second inversion path.

14. The method according to claim 11, wherein the rectifier bridge comprises a second controllable switching element, a third controllable switching element, and a fourth controllable switching element and wherein the method further comprises controlling the first, second, third, and fourth controllable switching elements individually in response to specific patterns in the sense signal.

15. The method according to claim 11, wherein the sense signal is based on a voltage between two input terminals of the rectifier circuit connected to the energy source.

16. A rectifier circuit comprising
a pair of input terminals;
a pair of output terminals;
a first circuit interconnecting the pair of input terminals, the first circuit comprising an energy storing element and a rectifier bridge, wherein the rectifier bridge comprises at least one controllable switching element per bridge branch, wherein an output of the rectifier bridge supplies the pair of output terminals and wherein the at least one controllable switching element per bridge branch is configured to provide a temporary conducting path via the rectifier bridge which bypasses the pair of output terminals and which short-circuits a series connection of the energy storing element and an energy source connectable to the pair of input terminals.

17. The rectifier circuit according to claim 16, wherein the energy storing element and the rectifier bridge are connected in series.

18. The rectifier circuit according to claim 16, wherein the rectifier bridge is configured to function both as an energy transferring component from the pair of input terminals to the pair of output terminals and as a voltage inverter for the pair of input terminals.

19. The rectifier circuit according to claim 16, wherein each bridge branch comprises a diode component and the at least one controllable switching element.

20. The rectifier circuit according to claim 16, further comprising a controller configured to generate at least one control signal for the at least one controllable switching element per bridge branch on the basis of a sense signal indicating a state of the energy source.

21. The rectifier circuit according to claim 20, wherein the controller is configured to cause a switching of the at least one controllable switching element from a conducting state to a non-conducting state, or vice versa, upon a detection of a peak in the sense signal.

22. The rectifier circuit according to claim 16, wherein the energy storing element forms a resonant circuit with the energy source while the series connection of the energy storing element and the energy source is short-circuited via the rectifier bridge.

23. The rectifier circuit according to claim 16, wherein the energy storing element is connectable in parallel to the energy source while the series connection of the energy storing element and the energy source is short-circuited via the rectifier bridge.

24. The rectifier according to claim 16, wherein the energy source is a piezoelectric element.

25. A method for rectifying an electrical current generated by an energy source, the method comprising:
applying the electrical current to a first circuit comprising a rectifier bridge and an energy storing element so that the rectifier bridge conducts the electrical current to an output of the rectifier bridge along a first rectification path associated with a first current flow direction of the electrical current;
detecting a first specific pattern in a sense signal determined on the basis of the electrical current;
reconfiguring the rectifier bridge, in response to detecting the first specific pattern, by switching a controllable switching element of the rectifier bridge from a non-conducting state to a conducting state so that the electrical current is conducted within the rectifier bridge along a first inversion path that short-circuits a series connection of the energy storing element and the energy source, wherein the first inversion path bypasses an output of the rectifier bridge; and
reconfiguring the rectifier bridge or allowing the rectifier bridge to perform a self-reconfiguration in response to a change of the current flow direction from the first current flow direction to a second current flow direction so that the rectifier bridge conducts the electrical current to the output of the rectifier bridge along a second rectification path associated with the second current flow direction.

26. A rectifier circuit comprising
a pair of input terminals;
a pair of output terminals;
a first circuit interconnecting the pair of input terminals, wherein the first circuit comprises an energy storing element and a rectifier bridge, wherein the rectifier bridge comprises parallel bridge branches between a first AC side terminal and a second AC side terminal of the rectifier bridge and at least one controllable switching element per bridge branch, wherein an output of the rectifier bridge supplies the pair of output terminals;
wherein the at least one controllable switching element per bridge branch is configured to receive a control signal and to assume, in response to a specific state of the control signal, a conducting state for providing a temporary conducting path via one of the parallel bridge branches of the rectifier bridge comprising said controllable switching element, the temporary conducting path bypassing the pair of output terminals and short-circuiting a series connection of the energy storing element and an energy source connectable to the pair of input terminals.

27. The rectifier circuit according to claim 26, wherein the energy storing element and the rectifier bridge are connected in series.

28. The rectifier circuit according to claim 26, wherein the rectifier bridge is configured to function both as an energy transferring component from the pair of input terminals to the pair of output terminals and as a voltage inverter for the pair of input terminals.

29. The rectifier circuit according to claim 26, wherein each bridge branch comprises a diode component and the at least one controllable switching element.

30. The rectifier circuit according to claim 26, further comprising a controller configured to generate the control signal for the at least one controllable switching element per bridge branch on the basis of a sense signal indicating a state of the energy source.

31. The rectifier circuit according to claim 30, wherein the controller is configured to cause a switching of the at least one controllable switching element from a conducting state to a non-conducting state, or vice versa, upon a detection of a peak in the sense signal.

32. The rectifier circuit according to claim 26, wherein the energy storing element forms a resonant circuit with the energy source while the series connection of the energy storing element and the energy source is short-circuited via the rectifier bridge.

33. The rectifier circuit according to claim 26, wherein the energy storing element is connectable in parallel to the energy source while the second circuit is short-circuited via the rectifier bridge.

34. The rectifier circuit according to claim 26, wherein the energy source is a piezoelectric element.

\* \* \* \* \*